US005830788A

United States Patent [19]
Hiroki et al.

[11] Patent Number: 5,830,788
[45] Date of Patent: Nov. 3, 1998

[54] METHOD FOR FORMING COMPLEMENTARY MOS DEVICE HAVING ASYMMETRIC REGION IN CHANNEL REGION

[75] Inventors: Akira Hiroki, Izumi; Shinji Odanaka, Hirakata, both of Japan

[73] Assignee: Matsushita Electric Industrial Co., Ltd., Osaka, Japan

[21] Appl. No.: 879,579

[22] Filed: Jun. 20, 1997

[30] Foreign Application Priority Data

Jun. 21, 1996 [JP] Japan ..................................... 8-161352

[51] Int. Cl.$^6$ .............................................. H01L 21/8238
[52] U.S. Cl. .......................... 438/199; 438/217; 438/227; 438/231; 438/286; 438/302; 438/303; 438/305; 438/307; 438/525; 257/344; 257/346; 257/369
[58] Field of Search ..................................... 438/199, 217, 438/231, 227, 286, 302, 303, 305, 307, 525, 168, 204, 218; 257/344, 346, 369, 900

[56] References Cited

U.S. PATENT DOCUMENTS

| | | |
|---|---|---|
| 4,233,616 | 11/1980 | Kyomasu et al. . |
| 5,019,520 | 5/1991 | Komori et al. . |
| 5,170,232 | 12/1992 | Narita ..................................... 257/336 |

(List continued on next page.)

FOREIGN PATENT DOCUMENTS

| | | |
|---|---|---|
| 0 183 204 | 6/1986 | European Pat. Off. . |
| 0 186 058 | 7/1986 | European Pat. Off. . |
| 24 60 967 | 7/1976 | Germany . |
| 195 46 364 | 6/1996 | Germany . |
| 358093279 | 6/1983 | Japan ..................................... 438/169 |
| 59-82766 | 5/1984 | Japan . |
| 62-155565 | 7/1987 | Japan . |

(List continued on next page.)

OTHER PUBLICATIONS

A. Hiroki et al., "A High Performance 0.1 $\mu$m MOSFET with Asymmetric Channel Profile", IEDM 95, pp. 439–442, 1995.

S. Odanaka et al., "Potential Design and Transport Property of 0.1–$\mu$m MOSFET with Asymmetric Channel Profile", IEEE Transactions on Electron Devices, vol. 44, No. 4, pp. 595–600, 1997.

T. Matsuki et al., "Laterally–Doped Channel (LDC) Structure for Sub–Quarter Micron MOSFETs", 1991 Symposium on VLSI Technology, pp. 113–114, 1991.

International Search Report dated Jun. 14, 1996.

Y. Mii et al., "High Performance 0.1 $\mu$m nMOSFET's with 10 ps/stage Delay (85 K) at 1.5 V Power Supply", 1993 Symposium on VLSI Technology, pp. 91–92, 1993.

European Search Report dated Oct. 7, 1997.

*Primary Examiner*—Jey Tsai
*Assistant Examiner*—Long Pham
*Attorney, Agent, or Firm*—Ratner & Prestia

[57] ABSTRACT

A complementary semiconductor device which includes: a semiconductor substrate having a principal surface, with a first region doped with an impurity of a first conductivity type and a second region doped with an impurity of a second conductivity type; a first MOS transistor provided on the second region; and a second MOS transistor provided on the first region. In such a complementary semiconductor device, at least one of the first MOS transistor and the second MOS transistor is an asymmetric MOS transistor of the same conductivity type as the conductivity type of the corresponding region which is either the first region or the second region. The asymmetric MOS transistor further includes an asymmetric impurity diffusion region having a nonuniform impurity concentration distribution in the channel region along a channel length direction such that an impurity concentration on a source side is set to be higher than an impurity concentration on a drain side, and an impurity concentration of a portion of the semiconductor substrate beneath the first source region is lower than the impurity concentration on the source side of the asymmetric impurity diffusion region.

14 Claims, 10 Drawing Sheets

U.S. PATENT DOCUMENTS

| | | | |
|---|---|---|---|
| 5,217,910 | 6/1993 | Shimizu et al. | 437/35 |
| 5,320,974 | 6/1994 | Hori et al. | |
| 5,432,103 | 7/1995 | Miller | 437/45 |
| 5,500,379 | 3/1996 | Odake et al. | |
| 5,510,279 | 4/1996 | Chien et al. | 437/41 |
| 5,516,711 | 5/1996 | Wang | |
| 5,594,264 | 1/1997 | Shirahata et al. | |
| 5,614,432 | 3/1997 | Goto | 437/56 |
| 5,668,024 | 9/1997 | Tsai et al. | 438/199 |
| 5,686,324 | 11/1997 | Wang et al. | 437/34 |

FOREIGN PATENT DOCUMENTS

| | | |
|---|---|---|
| 62-195176 | 8/1987 | Japan . |
| 62-217666 | 9/1987 | Japan . |
| 2-30185 | 1/1990 | Japan . |
| 4-127537 | 4/1992 | Japan . |
| 4-144237 | 5/1992 | Japan . |
| 4-186732 | 7/1992 | Japan . |
| 7-297397 | 11/1995 | Japan . |
| 2 277 406 | 10/1994 | United Kingdom . |
| WO 96/16432 | 5/1996 | WIPO . |

METHOD FOR FORMING COMPLEMENTARY MOS DEVICE HAVING ASYMMETRIC REGION IN CHANNEL REGION

BACKGROUND OF THE INVENTION

1. Field of the Invention

The present invention relates to a complementary semiconductor device and a method for producing the same. More particularly, the present invention relates to a complementary semiconductor device and a method for producing the same, by which a highly reliable high-speed semiconductor integrated circuit which can be operated with low power consumption can be provided while realizing a fine metal-oxide-semiconductor (MOS) type semiconductor device.

2. Description of the Related Art

Recently, in order to realize a very large-scale integrated circuit (VLSI) having even higher integration, the size of a MOS type semiconductor device usable for such a VLSI has been reduced even more in recent years. As a result, currently available semiconductor devices are formed with a minimum size in a half-micron region or in a sub-half micron region. At this stage of development, attempts have been made to produce a prototype semiconductor having a size on the order of a quarter micron or a subquarter micron.

However, if a device having such a small size is formed, the electric characteristics of the device are likely to be degraded because of a short-channel effect or a hot-carrier effect, thereby seriously influencing the reliability of the device.

On the other hand, in order to develop VLSI technologies satisfactorily applicable in the expanding multi-media society, a semiconductor device must realize not only high-speed operation but also low power consumption.

In order to improve the resistance of a device to the degradation caused by a hot-carrier effect or a short-channel effect, and to improve the drivability thereof, a MOS type semiconductor device having an asymmetric impurity concentration profile in the channel has been proposed. Such a MOS semiconductor device is described, for example, by T. Matsui et al. in 1991 Symposium on VLSI Technology, pp. 113–114, in which a laterally-doped channel (LDC) structure is proposed.

FIG. 1 is a cross-sectional view showing a MOS type semiconductor device 50 having an LDC structure.

The semiconductor device 50 includes: an n-type high-concentration source diffusion layer 2 and an n-type high-concentration drain diffusion layer 3, which are formed in a semiconductor substrate 1; a gate oxide film 4 formed on the semiconductor substrate 1; a gate electrode 5 formed on the gate oxide film 4; and a p-type high-concentration diffusion layer 6' provided in a channel region between the source diffusion layer 2 and the drain diffusion layer 3 and under the source diffusion layer 2 in the semiconductor substrate 1. The ptype diffusion layer 6' is characterized in that the impurity concentration thereof monotonically decreases from the source side to the drain side.

In this structure, by setting the impurity concentration on the source side of the p-type diffusion layer 6' to be high, it is possible to improve the resistance of the device to the short-channel effect. In addition, by setting the impurity concentration on the drain side of the p-type diffusion layer 6' to be low, it is possible to reduce a high electric field generated in the vicinity of the drain, thereby suppressing the generation of hot carriers. Therefore, a conventional lightly-doped drain (LDD) structure is not required for this semiconductor device 50, thereby realizing high drivability.

However, this structure is not suitable for a MOS type semiconductor device to be formed in a region having a size on the order of a quarter micron or less. This is because, the MOS type semiconductor device 50 having the LDC structure shown in FIG. 1 has the following problems.

Firstly, a p-type high-concentration diffusion layer is provided under a source diffusion layer and the impurity concentration in the p-type diffusion layer is as high as $1 \times 10^{18}$ cm$^{-3}$ or more in order to suppress the short-channel effect. As a result, the parasitic capacitance of the p-n junction between the source and the substrate is adversely increased as compared with a conventional structure.

In general, the speed of a MOS type semiconductor device (the speed as a whole circuit) is proportional to the product obtained by multiplying together the inverse of a saturated current value and a load capacitance. Therefore, if such a semiconductor device having a large parasitic capacitance in the p-n junction between the source and the substrate, as in the case of a semiconductor device 50 shown in FIG. 1 having an LDC structure, is applied to a circuit such as a NAND type CMOS circuit in which a voltage is applied to a region between the source and the substrate, the speed of the device (the speed as a whole circuit) is adversely decreased.

On the other hand, the power consumed by a MOS type semiconductor device is proportional to the product obtained by multiplying together the load capacitance and the square of the applied voltage. Therefore, if a large parasitic capacitance exists in the p-n junction between the source and the substrate, the power consumption of the circuit is adversely increased.

Secondly, when a device having a size on the order of a quarter micron or less is formed, the threshold voltage is decreased and the device becomes seriously affected by the short-channel effect. The short-channel effect depends upon an effective channel length and a junction depth between the source diffusion layer and the drain diffusion layer. Since an LDC structure has a deep junction depth between the source diffusion layer and the drain diffusion layer, the decrease in the threshold voltage cannot be suppressed in a region having a size on the order of a quarter micron or less.

According to the conventional technologies of forming a MOS type semiconductor device, because of the above-described reasons, a highly reliable high-speed semiconductor device cannot be formed in a region having a size on the order of a quarter micron or less.

SUMMARY OF THE INVENTION

In accordance with one aspect of the present invention, a complementary semiconductor device which includes: a semiconductor substrate having a principal surface, with a first region doped with an impurity of a first conductivity type and a second region doped with an impurity of a second conductivity type; a first MOS transistor provided on the second region; and a second MOS transistor provided on the first region. In such a complementary semiconductor device, each of the first MOS transistor and the second MOS transistor includes; a first source region; a first drain region located so as to be separated from the first source region by a prescribed distance; a second source region making contact with the first source region and the principal surface of the semiconductor substrate and having a junction depth shallower than a junction depth of the first source region; a second drain region located so as to be separated from the second source region by a prescribed distance, making contact with the first drain region and the principal surface of the semiconductor substrate and having a junction depth shallower than a junction depth of the first drain region; a channel region located between the second source region and the second drain region; a gate insulating film formed on the principal surface of the semiconductor substrate so as to cover the channel region; and a gate electrode formed on the gate insulating film. Moreover, at least one of the first MOS transistor and the second MOS transistor is an asymmetric MOS transistor of the same conductivity type as the conductivity type of the corresponding region which is either the first region or the second region. The asymmetric MOS transistor further includes an asymmetric impurity diffusion region having a nonuniform impurity concentration distribution in the channel region along a channel length direction such that an impurity concentration on a source side is set to be higher than an impurity concentration on a drain side, and an impurity concentration of a portion of the semiconductor substrate beneath the first source region is lower than the impurity concentration on the source side of the asymmetric impurity diffusion region.

In one embodiment of the present invention, the first conductivity type is an n-type, the second conductivity type is a p-type, and the first MOS transistor is the asymmetric MOS transistor.

In another embodiment of the present invention, the first conductivity type is an n-type, the second conductivity type is a p-type, and the second MOS transistor is the asymmetric MOS transistor.

In still another embodiment of the present invention, the first conductivity type is an n-type, the second conductivity type is a p-type, and each of the first MOS transistor and the second MOS transistor is the asymmetric MOS transistor.

The complementary semiconductor device of the invention may be incorporated in a circuit in which a potential difference appears between the semiconductor substrate and the source of the asymmetric MOS transistor during operation. For example, the circuit has a configuration in which a plurality of MOS transistors of the same conductivity type as the conductivity type of the asymmetric MOS transistor are connected in series.

In one embodiment of the present invention, the first conductivity type is an n-type, the second conductivity type is a p-type, and the first MOS transistor is an n-channel type asymmetric MOS transistor including the asymmetric impurity diffusion region. Furthermore, the circuit is such that a potential difference appears between the semiconductor substrate and the source of the n-channel type asymmetric MOS transistor.

In another embodiment of the present invention, the first conductivity type is an n-type, the second conductivity type is a p-type, and the second MOS transistor is a p-channel type asymmetric MOS transistor including the asymmetric impurity diffusion region. Furthermore, the circuit is such that a potential difference appears between the semiconductor substrate and the source of the p-channel type asymmetric MOS transistor.

In still another embodiment of the present invention, the first conductivity type is an n-type, the second conductivity type is a p-type, the first MOS transistor is an n-channel type asymmetric MOS transistor including the asymmetric impurity diffusion region, and the second MOS transistor is a p-channel type asymmetric MOS transistor including the asymmetric impurity diffusion region. In addition, the circuit is such that a potential difference appears between the semiconductor substrate and the source of the n-channel type asymmetric MOS transistor and between the semiconductor substrate and the source of the p-channel type asymmetric MOS transistor.

In one embodiment of the present invention, the asymmetric MOS transistor may further include a punch-through stop layer.

In accordance with another aspect of the present invention, a method for producing a complementary semiconductor device including: a semiconductor substrate having a principal surface, with a first region doped with an impurity of a first conductivity type and a second region doped with an impurity of a second conductivity type; a first MOS transistor provided on the second region; and a second MOS transistor provided on the first region, includes the steps of: forming a first insulating film and a conductive film on the principal surface of the semiconductor substrate in this order so as to cover the first region and the second region, forming a gate insulating film and a gate electrode of each of the first MOS transistor and the second MOS transistor by patterning the first insulating film and the conductive film; forming a first resist on the principal surface of the semiconductor substrate so as to cover the second region; forming a source region and a drain region of the second MOS transistor, each having the second conductivity type, by implanting impurity ions of the second conductivity type into the first region while using the first resist and the gate electrode of the second MOS transistor as a mask; removing the first resist; forming a second resist on the principal surface of the semiconductor substrate so as to cover the first region; forming a source region and a drain region of the first MOS transistor, each having the first conductivity type, by implanting impurity ions of the first conductivity type into the second region while using the second resist and the gate electrode of the first MOS transistor as a mask; and forming an asymmetric impurity diffusion region with an asymmetric impurity concentration profile between the source region and the drain region of the first MOS transistor each having the first conductivity type, by obliquely implanting impurity ions of the second conductivity type into the second region while using the second resist and the gate electrode of the first MOS transistor as a mask.

In one embodiment of the present invention, the method for producing a complementary semiconductor further includes a step of forming an extension of the source region making contact with the source region of the first MOS transistor and the principal surface of the semiconductor substrate and having a junction depth shallower than a junction depth of the source region, and an extension of the drain region making contact with the drain region of the first MOS transistor and the principal surface of the semiconductor substrate and having a junction depth shallower than a junction depth of the drain region. The asymmetric impurity diffusion region in the first MOS transistor may be formed so as to reach an end of the extension of the drain region.

In one embodiment of the present invention, the first conductivity type is an n-type, the second conductivity type is a p-type, and the first MOS transistor is an n-channel type MOS transistor including the asymmetric impurity diffusion region.

In another embodiment of the present invention, the first conductivity type is a p-type, the second conductivity type is an n-type, and the first MOS transistor is a p-channel type MOS transistor including the asymmetric impurity diffusion region.

The method for producing a complementary semiconductor device of the invention may further include a step of constituting a circuit such that a potential difference appears between the semiconductor substrate and the source of the first MOS transistor having the asymmetric impurity diffusion region during operation. For example, the circuit includes a configuration in which a plurality of MOS transistors of the same conductivity type as the conductivity type of the first MOS transistor are connected in series.

Furthermore, the method for producing a complementary semiconductor device of the invention may further include, between the step of forming the source region and the drain region of the second conductivity type of the second MOS transistor and the step of removing the first resist, a step of forming an asymmetric impurity diffusion region having an asymmetric impurity concentration profile between the source region and the drain region of the second conductivity type of the second MOS transistor by obliquely implanting impurity ions of the first conductivity type from the source side in the first region while using the first resist and the gate electrode of the second MOS transistor as a mask.

In one embodiment of the present invention, the method for producing a complementary semiconductor device further includes a step of forming an extension of the source region making contact with the source region of the second MOS transistor and the principal surface of the semiconductor substrate such that a junction depth of the extension is shallower than the junction depth of the source region, and an extension of the drain region making contact with the drain region of the second MOS transistor and the principal surface of the semiconductor substrate such that a junction depth of the extension is shallower than the junction depth of the drain region. The asymmetric impurity diffusion region in the second MOS transistor may be formed so as to reach an end of the extension of the drain region.

In one embodiment of the present invention, the first conductivity type is an n-type, the second conductivity type is a p-type, and the first MOS transistor is an n-channel type MOS transistor including the asymmetric impurity diffusion region.

In another embodiment of the present invention, the first conductivity type is a p-type, the second conductivity type is an n-type, and the first MOS transistor is a p-channel type MOS transistor having the asymmetric impurity diffusion region.

The method for producing a complementary semiconductor device of the invention may further include a step of constituting a circuit such that a potential difference appears during operation between the semiconductor substrate and the source of the first MOS transistor having the asymmetric impurity diffusion region and between the semiconductor substrate and the source of the second MOS transistor having the asymmetric impurity diffusion region. For example, the circuit includes a configuration in which a plurality of MOS transistors of the same conductivity type as the conductivity type of the first MOS transistor are connected in series and a plurality of MOS transistors of the same conductivity type as the second MOS transistor are connected in series.

Thus, the invention described herein makes possible the advantages of providing (1) a highly reliable complementary semiconductor device having excellent resistance to a short-channel effect while improving the speed of the circuit and lowering power consumption; and (2) a method for producing such a complementary semiconductor device.

These and other advantages of the present invention will become apparent to those skilled in the art upon reading and understanding the following detailed description with reference to the accompanying figures.

DESCRIPTION OF THE PREFERRED EMBODIMENTS

In this specification, the portion of a channel region of a semiconductor device ranging from a position adjacent to a source diffusion layer to the center of the channel region will be referred to as a "source side portion of a channel regions". On the other hand, the portion of the channel region ranging from the position adjacent to a drain diffusion layer to the center of the channel region will be referred to as a "drain side portion of a channel region".

In a semiconductor device according to the present invention, the impurity concentration in the channel region is varied along the channel length direction because of the presence of an impurity diffusion layer formed in the channel region. More specifically, the impurity is distributed in the channel region such that the concentration thereof decreases from the source diffusion layer to the drain diffusion layer. Therefore, if a voltage is applied to a region between the source diffusion layer and the drain diffusion layer, the electric field formed in the source side portion of the channel region becomes higher as compared with a case where the impurity concentration in the channel region is uniform along the channel length direction.

By setting the electric field in the source side portion of the channel region to be higher in such a manner, the carriers cause a speed overshoot in the source side portion of the channel region. A "speed overshoot" refers to the state of the carriers where the carriers obtain a non-equilibrium high energy from the electric field and are transferred at a speed higher than the saturation speed (i.e., higher than the speed in an equilibrium state) before some loss is caused in the speed of the carriers due to the impurity scattering, lattice scattering, and the like. A saturated current value is determined by the product obtained by multiplying together the speed of the carriers and the density of the carriers on the source side portion of the channel region. Furthermore, the speed of the carriers depends upon the difference of the voltages applied to the channel region.

According to the present invention, by causing a speed overshoot on the source side portion of the channel region, a saturated current value can be set higher as compared with that obtained in a conventional semiconductor device. In a conventional semiconductor device, the speed overshoot does not contribute to the increase in the saturated current since such a speed overshoot is caused only on the drain side portion of the channel region.

The above-described effects of the present invention will be further described with reference to FIG. 8.

Figure 8:
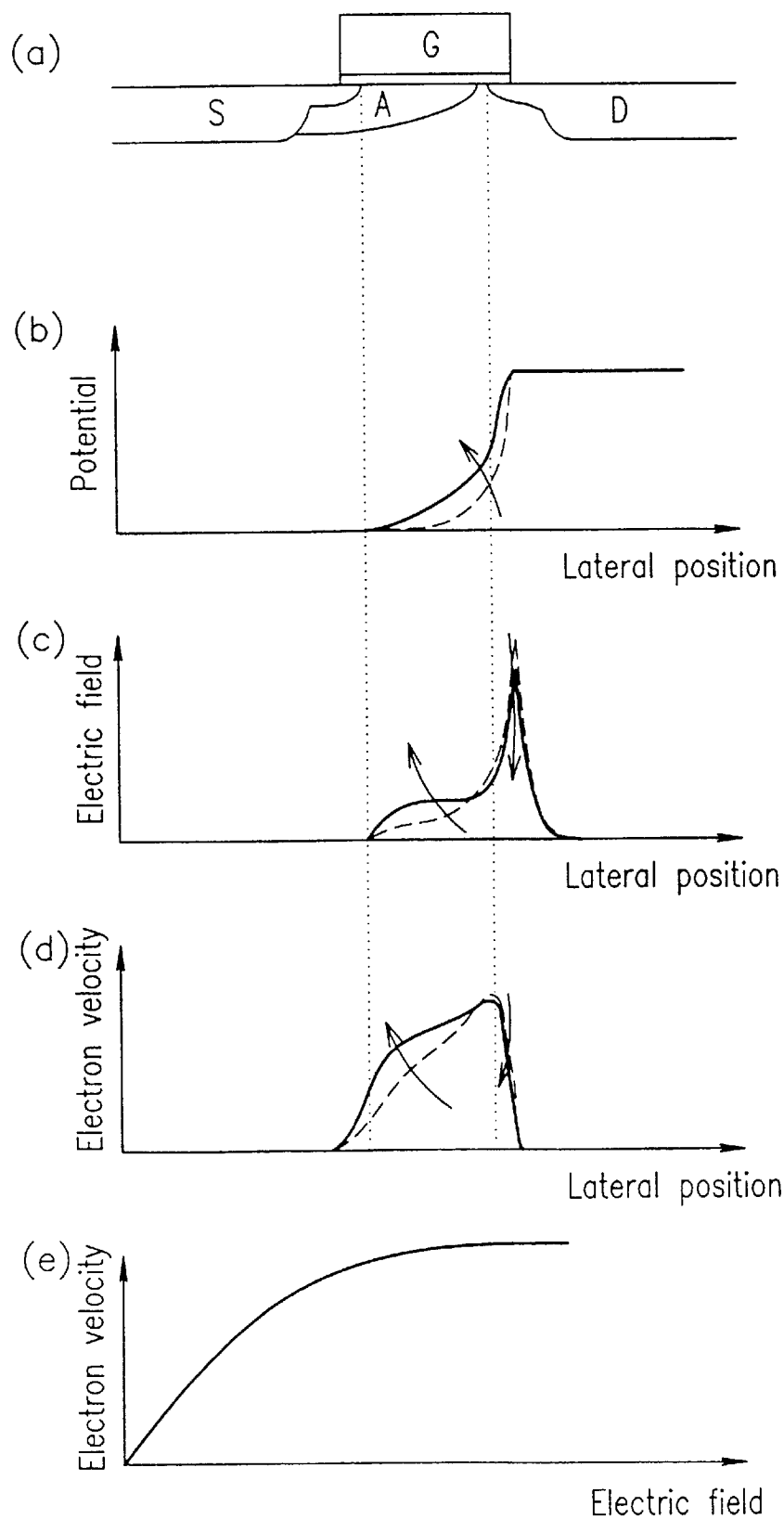
FIG. 8 is intended to explain advantages obtainable by the present invention, and in particular: the portion (a) of FIG. 8 is a schematic view showing a structure of a semiconductor device obtained by the present invention; the portion (b) of FIG. 8 is a diagram schematically showing the potential distribution between a source and a drain obtained upon application of a voltage therebetween; the portion (c) of FIG. 8 is a diagram schematically showing the electric field distribution between a source and a drain; the portion (d) of FIG. 8 is a diagram schematically showing the velocity of the electrons running inside a channel; and the portion (e) of FIG. 8 is a diagram schematically showing the relationship between the intensity of electric field and the electron velocity.

The portion (a) of FIG. 8 is a schematic view showing a structure of a semiconductor device obtained by the present invention. The semiconductor device according to the present invention includes a gate (G) provided on a channel region between a source region (S) with an extension and a drain region (D) with an extension. Furthermore, an asymmetric diffusion layer (A) having an asymmetric impurity concentration profile from the source region (S) to the drain region (D) is provided in the channel region.

The portion (b) of FIG. 8 is a diagram schematically showing the potential distribution between the source and the drain upon application of a voltage therebetween. The semiconductor device having the asymmetric diffusion layer (A) according to the present invention Is capable of having greater potential, particularly on the source side, as represented by a solid line, as compared with the potential distribution of a conventional semiconductor (represented by a broken line) which does not include such an asymmetric diffusion layer.

The portion (c) of FIG. 8 is a diagram schematically showing the electric field distribution between the source and the drain (shown as a differential of the potential distribution curve shown in the portion (b) of FIG. 8). The electric field of the semiconductor device according to the present invention having the asymmetric diffusion layer (A) (as represented by a solid line), reflecting the change in the potential distribution described with reference to the portion (b) of FIG. 8, is larger on the source side and smaller on the drain side as compared to the electric field of a conventional semiconductor device with no asymmetric diffusion layer (represented by a broken line).

Due to such an electric field distribution, as schematically shown in the portion (d) of FIG. 8, the velocity of the electrons running inside the channel of the semiconductor device according to the present invention (represented by a solid line) is greater in the vicinity of the source as compared to that of the conventional semiconductor device (represented by a broken line). Accordingly, the current driving force of the semiconductor device according to the present invention is enhanced.

As shown in the portions (c) and (d) of FIG. 8, according to the present invention, the intensity of electric field in the vicinity of the drain is slightly deteriorated as compared to the results of the conventional technology, As a result, the velocity of electrons is slightly lowered. However, as can be appreciated from the relationship between the intensity of electric field and the electron velocity shown in the portion (e) of FIG. 8, when the intensity of electric field exceeds a certain level, the electron velocity is saturated due to effects such as phonon scattering. Thus, in practice, the decrease in the intensity of electric field in the vicinity of the drain, where the intensity of electric field is already large, does not cause significant adverse effect on the electron velocity. On the contrary, desirable effect on the electron velocity due to enhancement of the intensity of electric field in the vicinity of the source, where, conventionally only small intensity of electric field is obtained, is remarkable.

Hereinafter, preferred embodiments of a semiconductor device and a method for producing the same according to the present invention will be described with reference to the accompanying drawings.

Herein, examples will be described for the case where the present invention is applied to a single MOS semiconductor device and a method for producing the same, followed by examples for the case where the present invention is applied to a complementary semiconductor device and a method for producing the same. Thereafter, examples of circuits capable of bringing out remarkable effects of a complementary semiconductor device according to the present invention will be further described.

Example 1

Figure 2A:
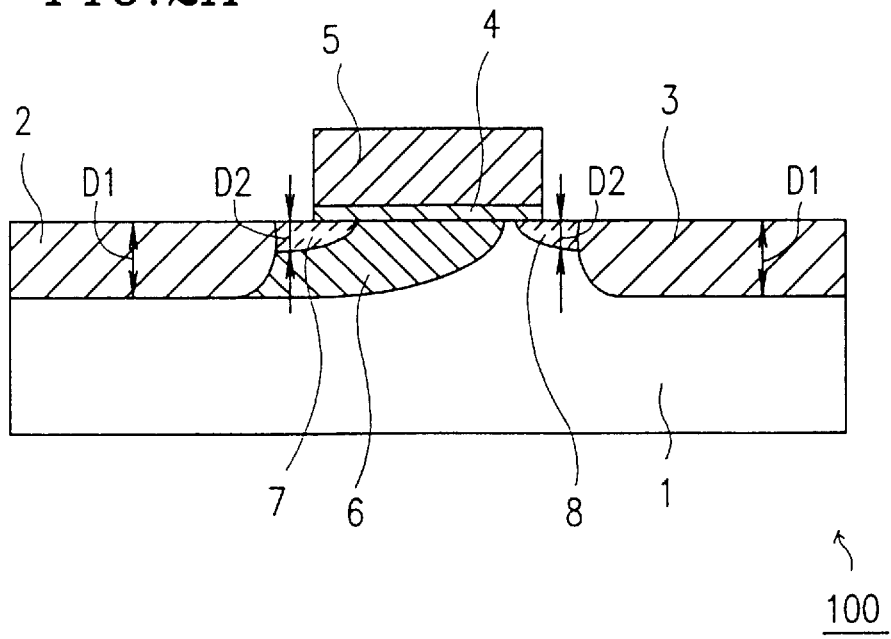
FIGS. 2A and 2B are cross-sectional views respectively showing a structure of a semiconductor device according to a first example of the present invention.
Figure 2B:
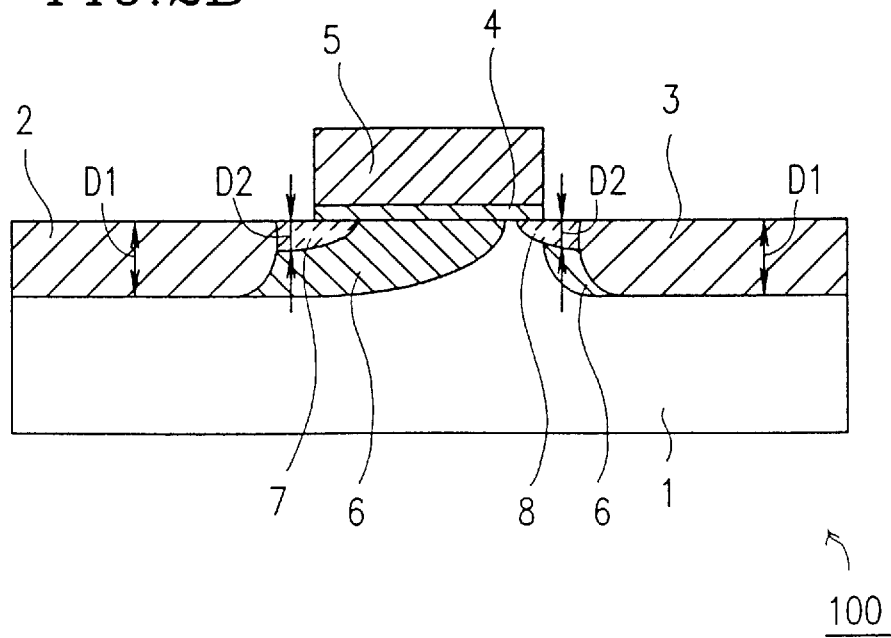

FIGS. 2A and 2B are cross-sectional views respectively showing a semiconductor device 100 according to a first example of the present invention.

As shown in FIG. 2A or 2B, the semiconductor device 100 includes: a p-type semiconductor substrate 1; a first n-type high-concentration source diffusion layer 2 and a first n-type high-concentration drain diffusion layer 3, which are formed in respective regions under the principal surface of the semiconductor substrate 1; and a channel region formed in the semiconductor substrate 1 so as to be located between the first source diffusion layer 2 and the first drain diffusion layer 3. A gate insulating film 4 is provided on the channel region, A gate electrode 5 is provided on the gate insulating film 4.

A second n-type high-concentration source diffusion layer 7 and a second n-type high-concentration drain diffusion layer 8 are provided along the channel length direction so as to extend from the end of each of the first source diffusion layer 2 and the first drain diffusion layer 3. The impurity concentration of the first source/drain diffusion layers 2 and 3 is, for example, about $3\times10^{20}$ cm$^{-3}$, whereas the impurity concentration of the second source/drain diffusion layers 7 and 8 is, for example, about $1\times10^{20}$ cm$^{-3}$. The second source/drain diffusion layers 7 and 8 are not formed to constitute a general LDD structure but formed to act as extensions of the first source/drain diffusion layers 2 and 3.

Furthermore, a p-type impurity diffusion layer 6 is formed in the channel region. The p-type impurity diffusion layer 6 has a nonuniform impurity concentration profile along a channel length direction. According to the first example of the present invention, the impurity concentration of the channel region is set such that the impurity concentration of the portion adjacent to the source diffusion layer 2 (for example, about $4 \times 10^{17}$ cm$^{-3}$) is higher than that of the portion in the vicinity of the drain diffusion layer 3 (for example, about $1 \times 10^{16}$ cm$^{-3}$). The p-type impurity diffusion layer 6 is formed at least from the source diffusion layer 2 toward the drain diffusion layer 3 in the channel region, as shown in FIG. 2A. Alternatively, the p-type impurity diffusion layer 6 may be formed so that a portion thereof is also disposed at the location beneath the second drain diffusion layer 8, as shown in FIG. 2B. In this case, the portion of the p-type impurity diffusion layer 6 beneath the second drain diffusion layer 8 functions as a punch-through stop layer.

In the above-described structure of the semiconductor device 100 shown in FIGS. 2A and 2B, the source diffusion layers 2 and 7, and the drain diffusion layers 3 and 8, are located so as to be symmetrical with respect to a plane vertical to the primary surface of the semiconductor substrate 1. However, the impurity concentration profile in the channel region is asymmetric with respect to the same plane. This asymmetric profile is caused by the p-type impurity diffusion layer 6. Hereinafter, the p-type impurity diffusion layer 6 Is also referred to as an "Asymmetric diffusion layer 6".

Figure 3A:
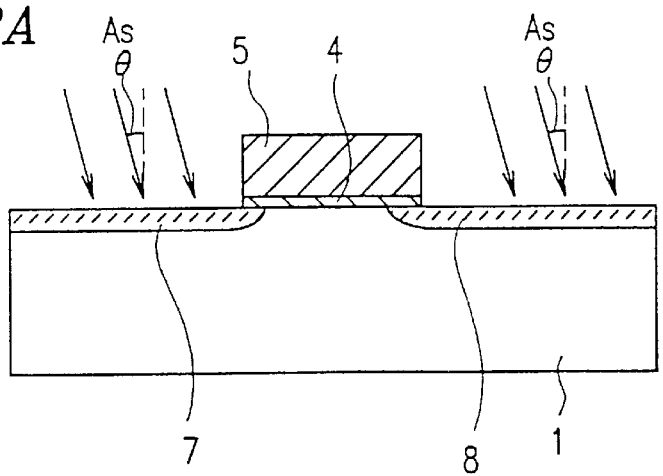
FIGS. 3A to 3C are cross-sectional views showing respective process steps for producing a semiconductor device according to a second example of the present invention.
Figure 3B:
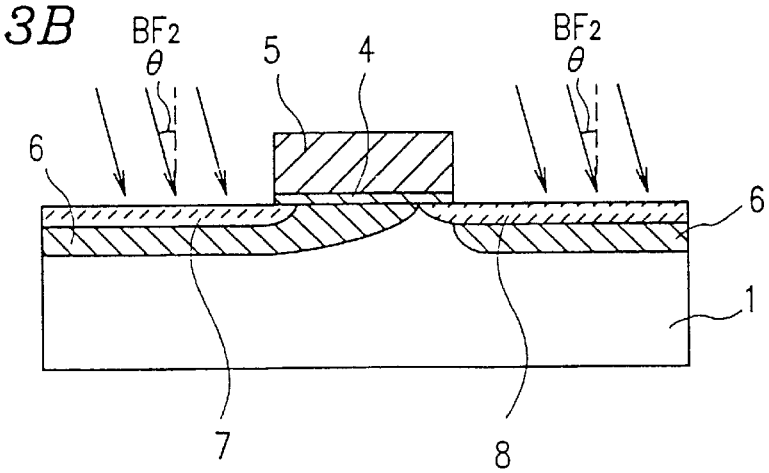
Figure 3C:
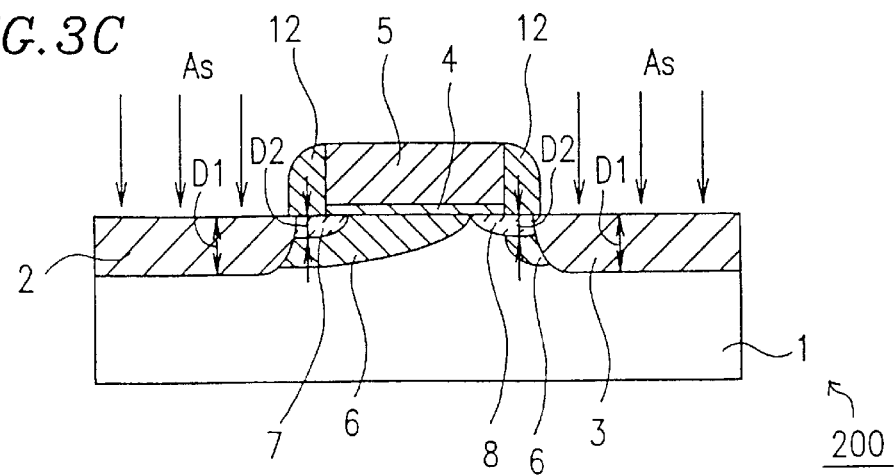

Although not shown in FIGS. 2A and 2B, gate side walls (side wall spacers) may be formed along the side faces of the gate electrode 5 (for example, see FIG. 3C).

According to the first example, the p-type impurity diffusion layer (the asymmetric diffusion layer) 6 is formed so as not to cover the entire source diffusion layer 2. Therefore, the impurity concentration of the semiconductor substrate 1 immediately beneath the source diffusion layer 2 is, for example, about $1 \times 10^{17}$ cm$^{-3}$, and is set to be lower than the previously-described impurity concentration on the source side of the p-type impurity diffusion layer 6 (for example, about $4 \times 10^{17}$ cm$^{-3}$). The above-mentioned impurity concentration of the semiconductor substrate 1 immediately beneath the source diffusion layer 2 is lower than an impurity concentration of a semiconductor substrate immediately beneath a source diffusion layer in a conventional LDC structure ($1 \times 10^{18}$ cm$^{-3}$). Accordingly, a capacitance in the p-n junction between the source and the substrate of the semiconductor device 100 shown in FIGS. 2A and 2B is smaller than that of the conventional semiconductor device having the LDC structure.

In general, the speed of a semiconductor device is proportional to the product obtained by multiplying together a load capacitance and the inverse of a current value. Thus, even in the case where the semiconductor device 100 according to the first example of the present invention is applied to a NAND type CMOS circuit in which a voltage is applied to a region between the source and the substrate, the speed of the device (the speed as a whole circuit) is not deteriorated. Furthermore, the power consumed by a semiconductor device is proportional to the product obtained by multiplying together the load capacitance and the square of the applied voltage. Therefore, the semiconductor device 100 according to the first example of the present invention can be operated with low power consumption.

As described above, the impurity concentration profile of the p-type impurity diffusion layer 6 is nonuniform along the channel length direction and the impurity concentration on the source side of the channel region is set to be higher than that on the drain side. As a result, the intensity of the electric field components generated in the channel region along the channel length direction is increased on the source side, but are decreased on the drain side, when compared with the case where the impurity is uniformly distributed in the channel region. Since the saturated current of a MOS type semiconductor device is determined by the electric field on the source side, it is possible to increase the saturated current and realize a high-speed semiconductor device according to the present invention. Also, since the generation rate of the hot carriers is determined by the electric field on the drain side, it is possible to reduce the generation rate of the hot carriers and realize a highly reliable semiconductor device according to the present invention.

Moreover, since the impurity concentration of the p-type impurity diffusion layer 6 is gradually decreased from the source side to the drain side, the intensity of the electric field components generated in the channel region along the channel length direction is not decreased in the center of the channel as compared to those in the vicinity of the source. As a result, the carriers that are accelerated by the electric field in the vicinity of the source can run inside the channel without decreasing the speed thereof.

Furthermore, the second n-type source/drain diffusion layers 7 and 8 are formed such that the impurity concentration thereof are $1 \times 10^{19}$ cm$^{-3}$ or more and the thickness thereof (junction depth D2) is smaller than the thickness of the first n-type source/drain diffusion layers 2 and 3 (junction depth D1). Thus, the extension of the potential curve (the expansion of the depletion layer) from the source/drain diffusion layers in the channel length direction can be effectively suppressed and the degradation in the threshold potential in the initial stage, which is adversely caused in a region having a size on the order of a quarter micron or less, can be suppressed.

Additionally, when the impurity concentration of the second n-type source diffusion layer 7 is set to be higher than the impurity concentration of the second n-type drain diffusion layer 8, a semiconductor device which has high drivability and is highly resistant to the short-channel effect can be obtained without causing a degradation in the drivability by the parasitic resistance.

In the semiconductor device 100 according to the first example of the present invention having the above-described structure, the p-type impurity diffusion layer (the asymmetric diffusion layer) 6 which extends from the source side of the channel to the drain side may be formed such that it terminates at any point in the channel region. Alternatively, it is more effective in terms of suppressing the decrease in the carrier speed in the channel, when the asymmetric diffusion layer 6 is formed so as to reach to the end of the channel on the drain side (for example, to the end of the second n-type drain diffusion layer 8).

Thus according to the first example of the present invention, a highly reliable high-speed semiconductor device 100 can be realized.

Example 2

FIGS. 3A to 3C are cross-sectional views showing respective process steps for producing a semiconductor device 200 according to a second example of the present invention.

First, as shown in FIG. 3A, a gate oxide film 4 is formed on a principal surface of a semiconductor substrate 1 of a first conductivity type (p-type) and then a conductive film to be used as a gate electrode 5 is deposited thereon, thereby forming a multi-layered film. Then, a predetermined portion of the multi-layered film is selectively etched away by photo-lithography and anisotropic etching until the gate oxide film 4 is exposed, thereby forming the gate electrode 5.

Then, impurity ions of a second conductivity type (n-type), e.g., arsenic (As) ions, are obliquely implanted into the semiconductor substrate 1 from the source side while using the gate electrode 5 as a mask, under the following conditions: an implantation angle of 7 degrees or more, for example, 7 degrees; an implantation energy of 10 KeV; and an implant dose of approximately $2 \times 10^{14}$ cm$^{-2}$, thereby forming second source/drain diffusion layers 7 and 8 of the second conductivity type (n-type). In this specification, an "implantation angle" refers to the angle formed between a line vertical to the principal surface of the semiconductor substrate and the direction of the implanted ion beams.

Thereafter, as shown in FIG. 3B, a p-type impurity diffusion layer (asymmetric diffusion layer) 6 for controlling the threshold potential is formed by obliquely implanting impurity ions of the first conductivity type (p-type), e.g., BF$_2$ ions, from the source side while using the gate electrode 5 as a mask, under the following conditions: an implantation energy of 80 KeV; an implantation angle of 7 degrees or more, e.g., 7 degrees; and an implant dose of about $1.5 \times 10^{13}$ cm$^{-2}$. Under the above-mentioned conditions, the p-type impurity diffusion layer 6 having the impurity concentration of about $4 \times 17^{13}$ cm$^{-3}$ on the source end and of about $1 \times 10^{16}$ cm$^{-3}$ on the drain end is formed.

Next, as shown in FIG. 3C, after an oxide film is deposited to a thickness of about 80 nm, the oxide film is partially removed by anisotropic dry etching so that the oxide film is left only on the side faces of the gate electrode 5, thereby forming gate side walls (side wall spacers) 12. Then, impurity ions of a second conductivity type (n-type), e.g., As ions, are implanted while using the gate side walls 12 and the gate electrode 5 as a mask under the following conditions: an implantation energy of 40 KeV; and an implant dose of approximately $6 \times 10^{15}$ cm$^{-2}$, thereby forming first source/drain diffusion layers 2 and 3 of the second conductivity type (n-type). Under the above-described conditions, the first source/drain diffusion layers 2 and 3 having the impurity concentrations of about $3 \times 10^{20}$ cm$^{-3}$ is formed.

The portion of the previously formed p-type impurity diffusion layer 6 below the gate electrode 5 and the gate side walls 12 remains after the ion implantation step for forming the first source/drain diffusion layers 2 and 3. Similarly, the portion of the previously formed second source/drain diffusion layers 7 and 8 below the gate side walls 12 also remains after the same ion implantation step so as to act as the extensions of the source/drain diffusion layers. A portion of the p-type impurity diffusion layer 6 beneath the second drain diffusion layer 8 (the extension of the drain diffusion layer) functions as a punch-through stop layer. However, the formation of such a punch-through stop layer can be omitted. In addition, each of the diffusion layers with the prescribed shape may be formed by other methods without forming the gate side walls 12.

According to the method for producing the semiconductor device 200 of the second example of the present invention, ions of the first conductivity type (p-type) are implanted at an implantation angle of 7 degrees or more, from the source side while using the gate electrode 5 as a mask, so as to form the p-type impurity diffusion layer (asymmetric diffusion layer) 6 for controlling the threshold potential. As a result, an asymmetric diffusion layer 6 having a nonuniform impurity concentration profile in the channel such that the impurity concentration on the source side is higher than the impurity concentration on the drain side, can be easily formed without undergoing an additional masking process. Additionally, since the impurity concentration in the center portion of the channel is set to be lower than that in the vicinity of the source, a parasitic capacitance between the gate and the substrate is reduced as compared with that of a conventional semiconductor device including a diffusion layer with uniform impurity concentration and therefore, a semiconductor device 200 having high drivability can be easily fabricated.

In addition, in the above-described ion implantation step, by implanting the ions of the first conductivity type (p-type) at an angle of 7 degrees or more, the thickness (junction depth) of the asymmetric diffusion layer 6 can be set to be smaller than the thickness (junction depth) of the first source diffusion layer 2, Specifically, the asymmetric diffusion layer 6 is formed so as not to cover the entire source diffusion layer 2. As a result, an impurity concentration of a region of the semiconductor substrate 1 immediately beneath the first source diffusion layer 2 becomes lower than the impurity concentration on the source side of the asymmetric diffusion layer 6.

Moreover, according to the method of the second example of the present invention, prior to the formation of the asymmetric diffusion layer 6, n-type impurity ions, e.g., As ions, are obliquely implanted from the source side while using the gate electrode 5 as a mask, under the following conditions: an implantation energy of 10 KeV; an implant dose of about $2 \times 10^{14}$ cm$^{-2}$; and an implantation angle of 7 degrees or more, thereby forming the second n-type source/drain diffusion layers 7 and 8 as the extensions. The impurity concentration of the second n-type source/drain diffusion layers 7 and 8 becomes $1 \times 10^{19}$ cm$^{-3}$ or more.

Specifically, when the impurity concentration of the second n-type source diffusion layer 7 is set to be higher than the impurity concentration of the second n-type drain diffusion layer 8, the second n-type source/drain diffusion layers 7 and 8 having a sufficiently low resistance can be formed without causing adverse decrease in the parasitic resistance in diffusion layers having a shallow junction depth.

According to the method for producing the semiconductor device 200 of the second example of the present invention, an additional masking process step which is required in a method for producing a conventional LDC structure, is not necessary. When an additional masking process step is required for a currently available method for producing a semiconductor device, then the production period of a VLSI is adversely prolonged and the production cost is disadvantageously increased. However, according to the production method of the present invention, a semiconductor device can be easily fabricated during a short period of time and at a lower cost.

According to the second example of the present invention, the second n-type source/drain diffusion layers 7 and 8 are formed by implanting the n-type impurity ions while using the gate electrode 5 as a mask, and thereafter the p-type impurity diffusion layer 6 is formed by implanting the p-type impurity ions. However, the present invention is not limited thereto. Alternatively, the p-type impurity diffusion layer 6 may be formed by implanting the p-type impurity ions while using the gate electrode 5 as a mask and thereafter, the second n-type source/drain diffusion layers 7 and 8 can be formed by implanting the n-type impurity ions.

In a method for producing the semiconductor device 200 according to the second example of the present invention, the p-type impurity diffusion layer (the asymmetric diffusion layer) 6 which extends from the source side of the channel to the drain side may be formed such that it terminates at any point in the channel region. Alternatively, it is more effective in terms of suppressing the decrease in the carrier speed in the channel, when the asymmetric diffusion layer 6 is formed so as to reach to the end of the channel on the drain side (for example, to the end of the second n-type drain diffusion layer 8).

Example 3

Figure 4:
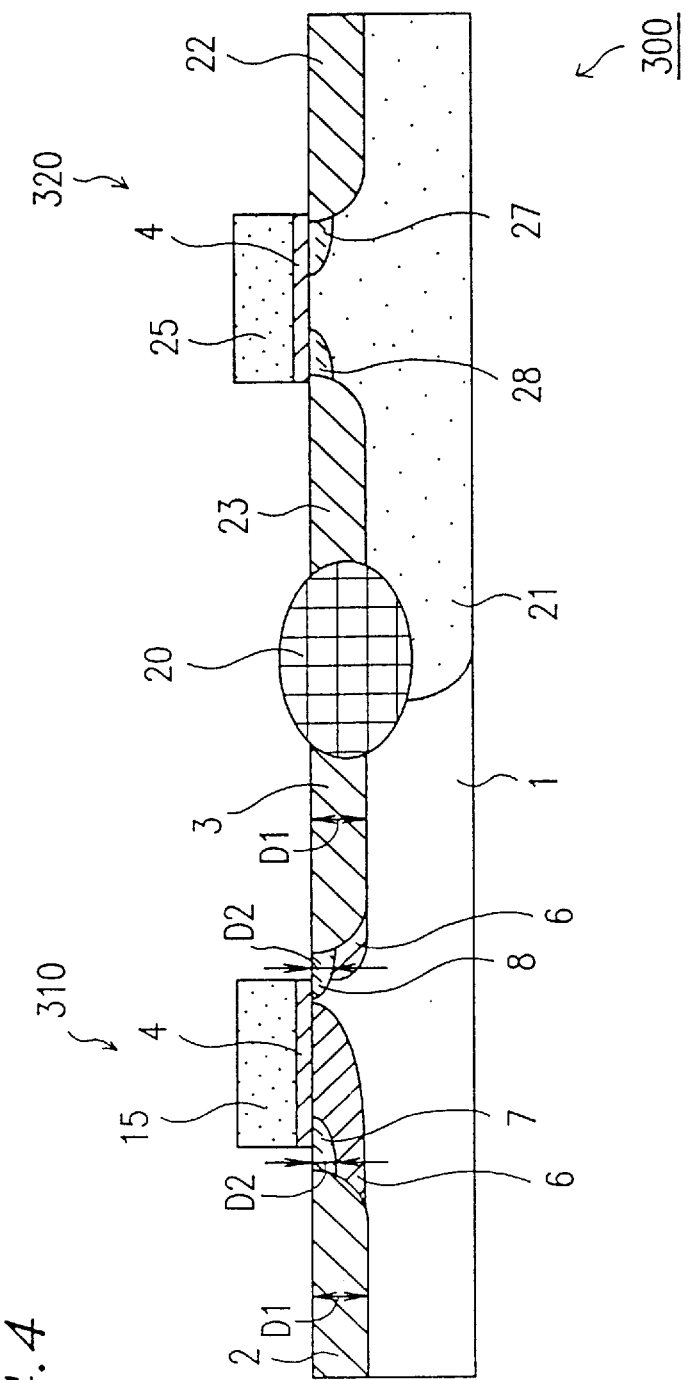
FIG. 4 is a cross-sectional view showing a structure of a complementary semiconductor device according to a third example of the present invention.

FIG. 4 is a cross-sectional view showing a complementary semiconductor device 300 according to a third example of the present invention.

As shown in FIG. 4, the semiconductor device 300 includes an n-channel type MOS transistor 310 formed in a predetermined region of a p-type semiconductor substrate 1 and a p-channel type MOS transistor 320 formed on an n-type well 21 in the p-type semiconductor substrate 1, the n-channel type MOS transistor 310 and the p-channel type MOS transistor 320 being separated by a partition region 20.

The n-channel type MOS transistor 310 includes: a first n-type high-concentration source diffusion layer 2 and a first n-type high-concentration drain diffusion layer 3, which are formed in a principal surface region of the p-type semiconductor substrate 1; and a channel region formed in the semiconductor substrate 1 so as to be located between the first source diffusion layer 2 and the first drain diffusion layer 3. A gate insulating film 4 is provided on the channel region. An n-type gate electrode 15 is provided on the gate insulating film 4.

A second n-type high-concentration source diffusion layer 7 and a second n-type high-concentration drain diffusion layer 8 are provided along the channel length direction so as to extend from the end of each of the first source diffusion layer 2 and the first drain diffusion layer 3. The impurity concentration of the first source/drain diffusion layers 2 and 3 is, for example, about $3 \times 10^{20}$ cm$^{-3}$, whereas the impurity concentration of the second source/drain diffusion layers 7 and 8 is, for example, about $1 \times 10^{20}$ cm$^{-3}$. The second source/drain diffusion layers 7 and 8 are not formed to constitute a general LDD structure but formed to act as extensions of the first source/drain diffusion layers 2 and 3.

Furthermore, a p-type impurity diffusion layer (asymmetric diffusion layer) 6 is formed in the channel region. The p-type impurity diffusion layer 6 has a nonuniform impurity concentration profile along a channel length direction. According to the third example of the present invention, the impurity concentration of the channel region is set such that the impurity concentration of the portion adjacent to the source diffusion layer 2 (for example, about $4 \times 10^{17}$ cm$^{-3}$) is higher than that of the portion in the vicinity of the drain diffusion layer 3 (for example, about $1 \times 10^{16}$ cm$^{-3}$). The p-type impurity diffusion layer 6 is formed at least from the source diffusion layer 2 toward the drain diffusion layer 3 in the channel region. Alternatively, the p-type impurity diffusion layer 6 may be formed so that a portion thereof is also disposed at the location beneath the second drain diffusion layer 8, as shown in FIG. 4. In this case, the portion of the p-type impurity diffusion layer 6 beneath the second drain diffusion layer 8 functions as a punch-through stop layer.

In the above-described structure of the n-channel type MOS transistor 310 shown in FIG. 4, the source diffusion layers 2 and 7, and the drain diffusion layers 3 and 8, are located so as to be symmetrical with respect to a plane vertical to the primary surface of the semiconductor substrate 1. However, the impurity concentration profile in the channel region is asymmetric with respect to the same plane. This asymmetric profile is caused by the p-type impurity diffusion layer (asymmetric diffusion layer) 6.

On the other hand, the p-channel type MOS transistor 320 includes a first p-type high-concentration source diffusion layer 22 and a first p-type high-concentration drain diffusion layer 23, which are formed in the principal region of the n-type well 21; and a channel region formed in the n-type well 21 so as to be located between the source diffusion layer 22 and the drain diffusion layer 23. A gate insulating film 4 is provided on the channel region. A p-type gate electrode 25 is provided on the gate insulating film 4.

A second p-type high-concentration source diffusion layer 27 and a second p-type high-concentration drain diffusion layer 28 are provided along the channel length direction so as to extend from the end of each of the first source diffusion layer 22 and the first drain diffusion layer 23. The impurity concentration of the first source/drain diffusion layers 22 and 23 is, for example, about $3 \times 10^{20}$ cm$^{-3}$, whereas the impurity concentration of the second source/drain diffusion layers 27 and 28 is about $5 \times 10^{19}$ cm$^{-3}$. Therefore, the second source/drain diffusion layers 27 and 28 are not formed to constitute a general LDD structure but formed to act as extensions of the first source/drain diffusion layers 22 and 23.

In the above-described structure of the p-channel type MOS transistor 320 shown in FIG. 4, the source diffusion layers 22 and 27, and the drain diffusion layers 23 and 28, are located so as to be symmetrical with respect to a plane vertical to the primary surface of the semiconductor substrate 1 (the n-type well 21) and the impurity concentration profile in the channel region is symmetric with respect to the same plane.

Figure 6A:
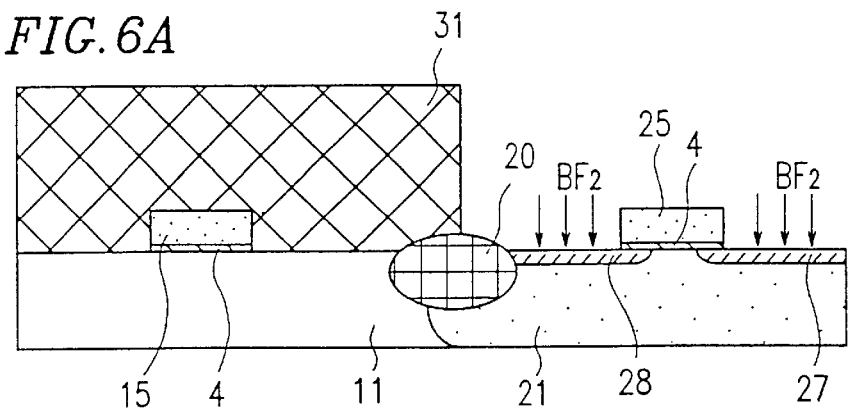
FIGS. 6A to 6D are cross-sectional views showing respective process steps for producing a semiconductor device according a fifth example of the present invention.
Figure 6B:
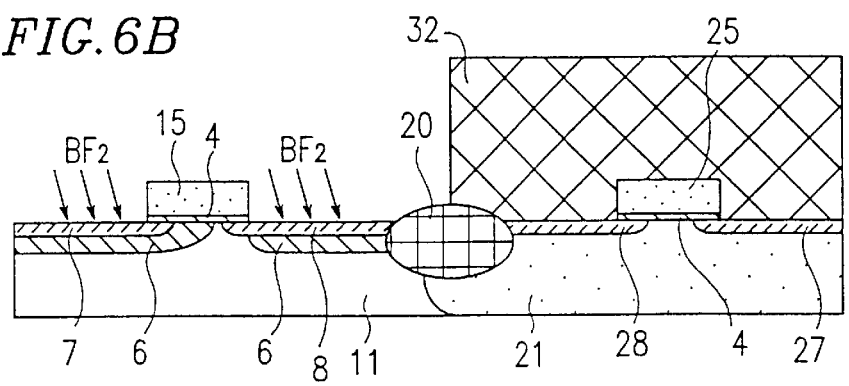
Figure 6C:
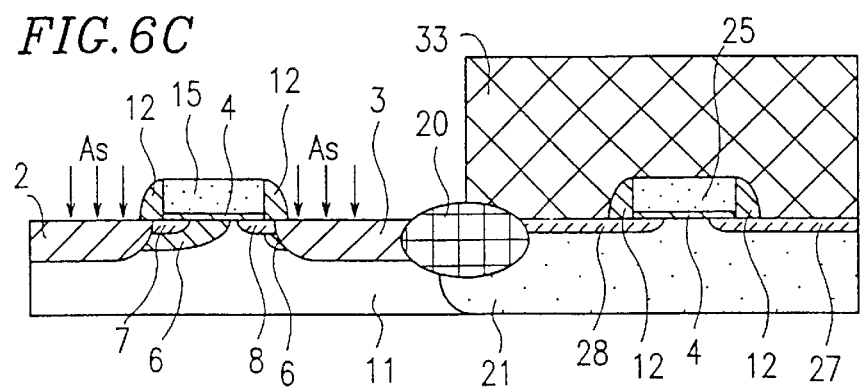
Figure 6D:
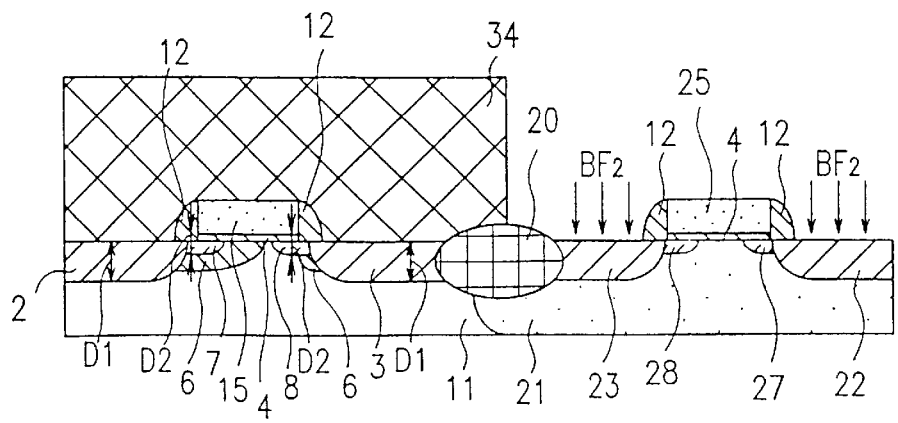

Furthermore, in each of the n-channel type and the p-channel type MOS transistors 310 and 320, although not shown in FIG. 4, gate side walls (side wall spacers) may be formed along the side faces of the gate electrodes 15 and 25 (e.g., see FIG. 6D).

In the complementary semiconductor device 300 according to the third example of the present invention, the p-channel type MOS transistor 320 has a uniform impurity concentration profile in the channel region whereas the n-channel type MOS transistor 310 has a nonuniform impurity concentration profile in the channel region.

In the n-channel type MOS transistor 310, the p-type impurity diffusion layer (the asymmetric diffusion layer) 6 is formed so as not to cover the entire source diffusion layer 2. Therefore, the impurity concentration of the semiconductor substrate 1 immediately beneath the source diffusion layer 2 is, for example, about $1 \times 10^f$cm$^{-3}$, and is set to be lower than the previously-mentioned impurity concentration on the source side portion of the p-type diffusion layer 6 (for example, about $4 \times 10^{17}$ cm$^{-3}$). The above-mentioned impurity concentration of the semiconductor substrate 1 immediately beneath the source diffusion layer 2 is lower than an impurity concentration of a semiconductor substrate immediately beneath a source diffusion layer in a conventional LDC structure ($1 \times 10^{19}$ cm$^{-3}$ or more). Accordingly, a capacitance in the p-n junction between the source and the substrate of the n-channel type MOS transistor 310 shown in FIG. 4 is smaller than that of the conventional semiconductor device having the LDC structure.

In general, the speed of a semiconductor device is proportional to the product obtained by multiplying together a load capacitance and the inverse of a current value. Thus, even in the case where the complementary semiconductor device 300 according to the third example of the present invention is applied to a NAND type CMOS circuit in which a voltage is applied to a region between the source and the substrate, the speed of the device (the speed as a whole circuit) is not deteriorated. Furthermore, the power consumed by a semiconductor device is proportional to the product obtained by multiplying together the load capacitance and the square of the applied voltage. Therefore, the complementary semiconductor device 300 according to the third example of the present invention can be operated with low power consumption.

As described above, in the n-channel type MOS transistor 310, the impurity concentration profile of the p-type impurity diffusion layer 6 is nonuniform along the channel length direction and the impurity concentration on the source side of the channel region is set to be higher than that on the drain side. As a result, the intensity of the electric field components generated in the channel region along the channel length direction are increased on the source side, but are decreased on the drain side, when compared to the case where the impurity is uniformly distributed in the channel region. Since the saturated current of a MOS type semiconductor device is determined by the electric field on the source side, it is possible to increase the saturated current and realize a high-speed semiconductor device according to the present invention. Also, since the generation rate of the hot carriers is determined by the electric field on the drain side, it is possible to reduce the generation rate of the hot carriers and realize a highly reliable semiconductor device according to the present invention.

Moreover, since the impurity concentration of the p-type impurity diffusion layer 6 is gradually decreased from the source side to the drain side, the intensity of the electric field components generated in the channel region along the channel length direction is not decreased in the center of the channel as compared to those in the vicinity of the source. As a result, the carriers that are accelerated by the electric field in the vicinity of the source can run inside the channel without decreasing the speed thereof.

Furthermore, in the n-channel type MOS transistor 310, the second n-type source/drain diffusion layers 7 and 8 are formed such that the impurity concentrations thereof is $1 \times 10^{19}$ cm$^{-3}$ or more and the thickness thereof (junction depth D2) is smaller than the thickness of the first n-type source/drain diffusion layers 2 and 3 (junction depth D1). Thus, the extension of the potential curve (the expansion of the depletion layer) from the n-type source/drain diffusion layers in the channel length direction can be effectively suppressed and the degradation in the threshold potential in the initial stage, which is adversely caused in a region having a size on the order of a quarter micron or less, can be suppressed.

In addition, in the p-channel type MOS transistor 320, the second p-type source/drain diffusion layers 27 and 28 are formed such that the impurity concentration thereof is $1 \times 10^{19}$ cm$^{-3}$ or more and the thickness thereof (Junction depth D2) is smaller than the thickness of the first p-type source/drain diffusion layers 22 and 23 (Junction depth DI). Thus, the extension of the potential curve (the expansion of the depletion layer) from the p-type source/drain diffusion layers in the channel length direction can be effectively suppressed and the degradation in the threshold potential in the initial stage, which is adversely caused in a region having a size on the order of a quarter micron or less, can be suppressed.

In the complementary semiconductor device 300 according to the third example of the present invention having the above-described structure, the p-type impurity diffusion layer (the asymmetric diffusion layer) 6 which extends from the source side of the channel to the drain side may be formed such that it terminates at any point in the channel region. Alternatively, it is more effective in terms of suppressing the decrease in the electric field in the channel, when the asymmetric diffusion layer 6 is formed so as to reach to the end of the channel on the drain side (for example, to the end of the second n-type drain diffusion layer 8).

Thus, according to the third example of the present invention, a highly reliable high-speed semiconductor device 300 can be realized.

In the above-described complementary semiconductor device 300 according to the third example, only the n-channel type MOS transistor 310 is formed so as to be asymmetric while the p-channel type MOS transistor 320 is formed so as to be symmetric. Alternatively, only the p-channel type MOS transistor may be formed so as to be asymmetric while the n-channel type MOS transistor is formed so as to be symmetric.

Example 4

Figure 5:
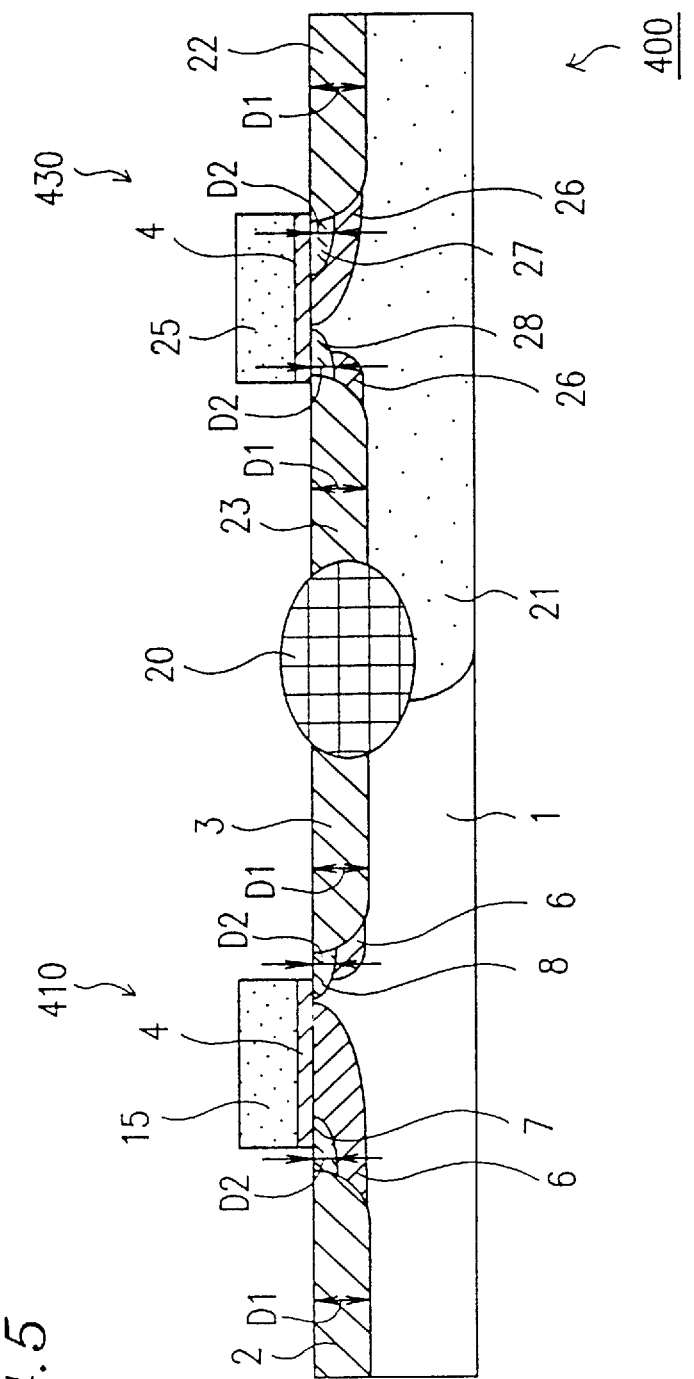
FIG. 5 is a cross-sectional view showing a complementary semiconductor device according to a fourth example of the present invention.

FIG. 5 is a cross-sectional view showing a complementary semiconductor device 400 according to a fourth example of the present invention.

As shown in FIG. 5, the semiconductor device 400 includes an n-channel type MOS transistor 410 formed in a predetermined region of a p-type semiconductor substrate 1 and a p-channel type MOS transistor 430 formed in an n-type well 21 in the p-type semiconductor substrate 1, the n-channel type MOS transistor 410 and the p-channel type MOS transistor 430 being separated by a partition region 20.

The n-channel type MOS transistor 410 includes: a first n-type high-concentration source diffusion layer 2 and a first n-type high-concentration drain diffusion layer 3, which are formed in a principal surface region of the p-type semiconductor substrate 1; and a channel region formed in the semiconductor substrate 1 so as to be located between the first source diffusion layer 2 and the first drain diffusion layer 3. A gate insulating film 4 is provided on the channel region. An n-type gate electrode 15 Is provided on the gate insulating film 4.

A second n-type high-concentration source diffusion layer 7 and a second n-type high-concentration drain diffusion layer 8 are provided along the channel length direction so as to extend from the end of each of the first source diffusion layer 2 and the first drain diffusion layer 3. The impurity concentration of the first source/drain diffusion layers 2 and 3 is, for example, about $3 \times 10^{20}$ cm$^{-3}$, whereas the impurity concentration of the second source/drain diffusion layers 7 and 8 is, for example, about $1 \times 10^{20}$ cm$^{-3}$. The second source/drain diffusion layers 7 and 8 are not formed to constitute a general LDD structure but formed to act as extensions of the first source/drain diffusion layers 2 and 3.

Furthermore, a p-type impurity diffusion layer (asymmetric diffusion layer) 6 is formed in the channel region. The p-type impurity diffusion layer 6 has a nonuniform impurity concentration profile along a channel length direction. According to the fourth example of the present invention, the impurity concentration of the channel region is set such that the impurity concentration of the portion adjacent to the source diffusion layer 2 (for example, about $4 \times 10^{17}$ cm$^{-3}$) is higher than that of the portion in the vicinity of the drain diffusion layer 3 (for example, about $1 \times 10^{16}$ cm$^{-3}$). The p-type impurity diffusion layer 6 is formed at least from the source diffusion layer 2 toward the drain diffusion layer 3 in the channel region. Alternatively, the p-type impurity diffusion layer 6 may be formed so that a portion thereof is also disposed at the location beneath the second drain diffusion layer 8, as shown in FIG. 5. In this case, the portion of the p-type impurity diffusion layer 6 beneath the second drain diffusion layer 8 functions as a punch-through stop layer.

In the above-described structure of the n-channel type MOS transistor 410 shown in FIG. 5, the source diffusion layers 2 and 7, and the drain diffusion layers 3 and 8, are located so as to be symmetric with respect to a plane vertical to the primary surface of the semiconductor substrate 1. However, the impurity concentration profile in the channel region is asymmetric with respect to the same plane. This asymmetric profile is caused by the p-type impurity diffusion layer (asymmetric diffusion layer) 6.

On the other hand, the p-channel type MOS transistor 430 includes a first p-type high-concentration source diffusion layer 22 and a first p-type high-concentration drain diffusion layer 23, which are formed in the principal region of the n-type well 21; and a channel region formed in the n-type well 21 so as to be located between the source diffusion layer 22 and the drain diffusion layer 23. A gate insulating film 4 is provided on the channel region. A p-type gate electrode 25 is provided on the gate insulating film 4.

A second p-type high-concentration source diffusion layer 27 and a second p-type high-concentration drain diffusion layer 28 are provided along the channel length direction so as to extend from the end of each of the first source diffusion layer 22 and the first drain diffusion layer 23. The impurity concentration of the first source/drain diffusion layers 22 and 23 is, for example, about $3 \times 10^{20}$ cm$^{-3}$, whereas the impurity concentration of the second source/drain diffusion layers 27 and 28 is, for example, about $5 \times 10^{19}$ cm$^{-3}$. Therefore, the second source/drain diffusion layers 27 and 28 are not formed to constitute a general LDD structure but formed to act as extensions of the first source/drain diffusion layers 22 and 23.

Furthermore, an n-type impurity diffusion layer (asymmetric diffusion layer) 26 is formed in the channel region. The n-type impurity diffusion layer 26 has a nonuniform impurity concentration profile along a channel length direction. According to the fourth example of the present invention, the impurity concentration of the channel region is set such that the impurity concentration of the portion adjacent to the source diffusion layer 22 (for example, about $7 \times 10^{17}$ cm$^{-3}$) is higher than that of the portion in the vicinity of the drain diffusion layer 23 (for example, about $2 \times 10^{16}$ cm$^{-3}$). The n-type impurity diffusion layer 26 is formed at least from the source diffusion layer 22 toward the drain diffusion layer 23 in the channel region. Alternatively, the n-type impurity diffusion layer 26 may be formed so that a portion thereof is also disposed at the location beneath the second drain diffusion layer 28, as shown in FIG. 5. In this case, the portion of the n-type impurity diffusion layer 26 beneath the second drain diffusion layer 28 functions as a punch-through stop layer.

In the above-described structure of the p-channel type MOS transistor 430 shown in FIG. 5, the source diffusion layers 22 and 27, and the drain diffusion layers 23 and 28, are located so as to be symmetric with respect to a plane vertical to the primary surface of the semiconductor substrate 1 (the n-type well 21). However, the impurity concentration profile in the channel region is asymmetric with respect to the same plane. This asymmetric profile is caused by the n-type impurity diffusion layer (asymmetric diffusion layer) 26.

Figure 7A:
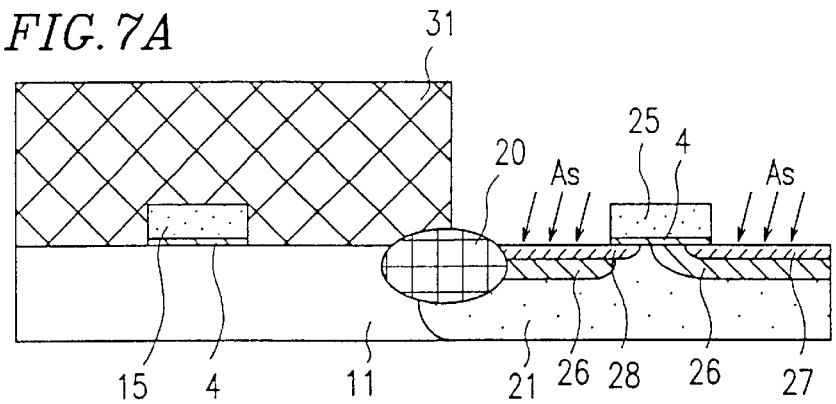
FIGS. 7A to 7D are cross-sectional views showing respective process steps for producing a semiconductor device according to a sixth example of the present invention.
Figure 7B:
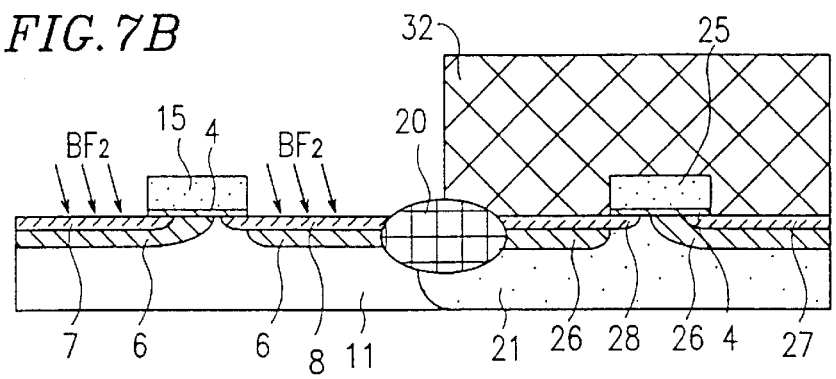
Figure 7C:
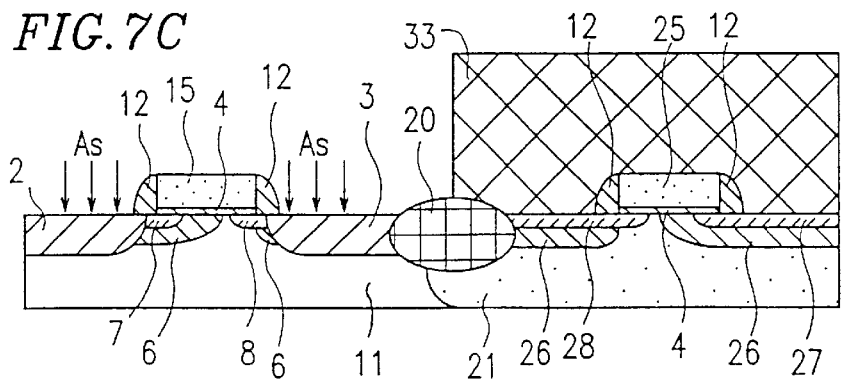
Figure 7D:
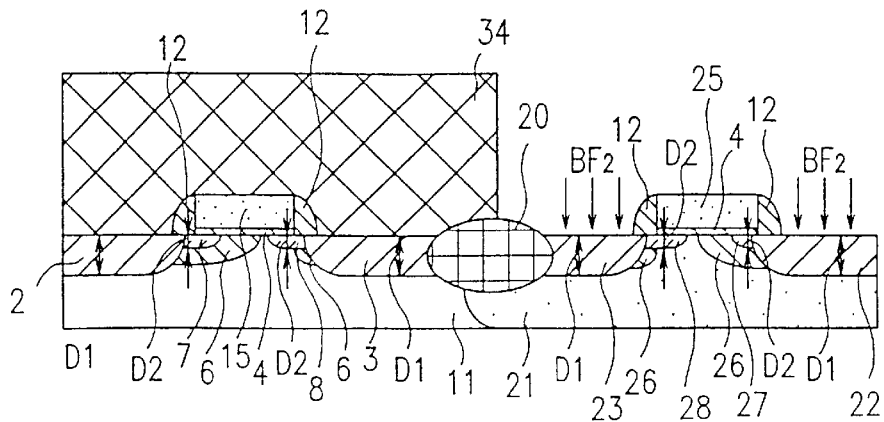

Furthermore, in the n-channel type and the p-channel type MOS transistors 410 and 430, although not shown in FIG. 5, gate side walls (side wall spacers) may be formed along the side faces of the gate electrodes 15 and 25 (e.g., see FIG. 7D).

In the complementary semiconductor device 400 according to the fourth example of the present invention, each of the n-channel type MOS transistor 410 and the p-channel type MOS transistor 430 has a nonuniform impurity concentration profile in the channel region. As to the p-channel type MOS transistor, conventionally, an attempt has been made to improve the drivability thereof by increasing the gate width thereof. However, by applying the present invention to the p-channel type MOS transistor so as to provide the nonuniform impurity concentration profile in the channel region, the gate width is no longer necessary to be increased for the above-mentioned purpose and thus, the size reduction of the device can be realized.

In the n-channel type MOS transistor 410, the p-type impurity diffusion layer (asymmetric diffusion layer) 6 is formed so as not to cover the entire source diffusion layer 2. Therefore, the impurity concentration of the semiconductor substrate 1 immediately beneath the source diffusion layer 2 is, for example, about $1 \times 10^{17}$ cm$^{-3}$, and is set to be lower than the impurity concentration of the source side portion of the p-type diffusion layer 6 (for example, about $4 \times 10^{27}$ cm$^{-3}$). The above-mentioned impurity concentration of the semiconductor substrate 1 immediately beneath the source diffusion layer 2 is lower than an impurity concentration of a semiconductor substrate immediately beneath a source diffusion layer in a conventional LDC structure ($1 \times 10^{18}$ cm$^{-3}$ or greater). Accordingly, a capacitance in the p-n junction between the source and the substrate of n-channel type MOS transistor 410 shown in FIG. 5 is smaller than that of the conventional semiconductor device having the LDC structure.

In general, the speed of a semiconductor device is proportional to the product obtained by multiplying together a load capacitance and the inverse of a current value. Thus, even in the case where the complementary semiconductor device 400 according to the fourth example of the present invention is applied to a NAND type CMOS circuit in which a voltage is applied to a region between the source and the substrate, the speed of the device (the speed as a whole circuit) is not deteriorated.

Furthermore, the power consumed by a semiconductor device is proportional to the product obtained by multiplying together the load capacitance and the square of the applied voltage. Therefore, the complementary semiconductor device 400 according to the fourth example of the present invention can be operated with low power consumption.

As described above, in the n-channel type MOS transistor 410, the impurity concentration profile of the p-type impurity diffusion layer 6 is nonuniform along the channel length direction and the impurity concentration of the source side portion of the channel region is set to be higher than that of the drain side portion. As a result, the intensity of the electric field components generated in the channel region along the channel length direction are increased on the source side, but are decreased on the drain side, when compared to the case where the impurity is uniformly distributed in the channel region. Since the saturated current of a MOS type semiconductor device is determined by the electric field on the source side, it is possible to increase the saturated current and realize a high-speed semiconductor device according to the present invention. Also, since the generation rate of the hot carriers is determined by the electric field on the drain side, it is possible to reduce the generation rate of the hot carriers and realize a highly reliable semiconductor device according to the present invention.

Moreover, since the impurity concentration of the p-type impurity diffusion layer 6 is gradually decreased from the source side to the drain side, the intensity of the electric field components generated in the channel region along the channel length direction is not decreased in the center of the channel as compared to those in the vicinity of the source. As a result, the carriers that are accelerated by the electric field in the vicinity of the source can run Inside the channel without decreasing the speed thereof.

Furthermore, in the n-channel type MOS transistor 410, the second n-type source/drain diffusion layers 7 and 8 are formed such that the impurity conoentra tions thereof is $1 \times 10^{19}$ cm$^{-3}$ or more and the thickness thereof (junction depth D2) is smaller than the thickness of the first n-type source/drain diffusion layers 2 and 3 (junction depth D1). Thus, the extension of the potential curve (i.e., the expansion of the depletion layer) from the n-type source/drain diffusion layers in the channel length direction can be effectively suppressed and the degradation in the threshold potential in the initial stage, which is adversely caused in a region having a size on the order of a quarter micron or less, can be suppressed.

In addition, in the p-channel type MOS transistor 430, the n-type impurity diffusion layer (asymmetric diffusion layer) 26 is formed so as not to cover the entire source diffusion layer 22. Therefore, the impurity concentration of the n-type well 21 immediately beneath the source diffusion layer 22 is, for example, about $1 \times 10^{17}$ cm$^{-3}$, and is set to be lower than the previously-mentioned impurity concentration of the source side portion of the n-type diffusion layer 26 (for example, about $7 \times 10^7$ cm$^{-3}$). The above-mentioned impurity concentration of the n-type well 21 immediately beneath the source diffusion layer 22 is lower than an impurity concentration of a semiconductor substrate immediately beneath a source diffusion layer in a conventional LDC structure ($1 \times 10^{18}$ cm$^{-3}$ or more). Accordingly, a capacitance in the p-n junction between the source and the well of the p-channel type MOS transistor 430 shown in FIG. 5 is smaller than that of the conventional semiconductor device having the LDC structure.

In general, the speed of a semiconductor device is proportional to the product obtained by multiplying together a load capacitance and the inverse of a current value. Thus, even in the case where the complementary semiconductor device 400 according to the fourth example of the present invention is applied to a NAND type CMOS circuit in which a voltage is applied to a region between the source and the well (substrate), the speed of the device (the speed as a whole circuit) is not deteriorated. Furthermore, the power consumed by a semiconductor device is proportional to the product obtained by multiplying together the load capacitance and the square of the applied voltage. Therefore, the complementary semiconductor device 400 according to the fourth example of the present invention can be operated with low power consumption.

As described above, in the p-channel type MOS transistor 430, the impurity concentration profile of the n-type impurity diffusion layer 26 is nonuniform along the channel length direction and the impurity concentration of the source side portion of the channel region is set to be higher than that of the drain side portion. As a result, the intensity of the electric field components generated in the channel region along the channel length direction are increased on the source side, but are decreased on the drain side, when compared to the case where the impurity is uniformly distributed in the channel region. Since the saturated current of a MOS type semiconductor device is determined by the electric field on the source side, it is possible to increase the saturated current and realize a high-speed semiconductor device according to the present invention. Also, since the generation rate of the hot carriers is determined by the electric field on the drain side, it is possible to reduce the generation rate of the hot carriers and realize a highly reliable semiconductor device according to the present invention.

Moreover, since the impurity concentration of the n-type impurity diffusion layer 26 is gradually decreased from the source side to the drain side, the intensity of the electric field components generated in the channel region along the channel length direction is not decreased in the center of the channel as compared to those in the vicinity of the source. As a result, the carriers that are accelerated by the electric field in the vicinity of the source can run inside the channel without decreasing the speed thereof.

The second p-type source/drain diffusion layers 27 and 28 of the p-channel type MOS transistor 430 are formed such that the impurity concentrations thereof are $1 \times 10^{19}$ cm$^{-3}$ or more and the thickness thereof (junction depth D2) is smaller than the thickness of the first p-type source/drain diffusion layers 22 and 23 (junction depth D1). Thus, the extension of the potential curve (the expansion of the depletion layer) from the p-type source/drain diffusion layers in the channel length direction can be effectively suppressed and the degradation in the threshold potential in the initial stage, which is adversely caused in a region having a size on the order of a quarter micron or less, can be suppressed.

In the complementary semiconductor device 400 according to the first example of the present invention having the above-described structure, the p-type or the n-type impurity diffusion layer (the asymmetric diffusion layer) 6 or 26 which extends from the source side of the channel to the drain side may be formed such that it terminates at any point in the channel region. Alternatively, it is more effective in terms of suppressing the decrease in the electric field in the channel, when the asymmetric diffusion layer 6 or 26 is formed so as to reach to the end of the channel on the drain side (for example, to the end of the second n-type or p-type drain diffusion layer 8 or 28).

Thus, according to the fourth example of the present invention, a highly reliable high-speed semiconductor device 400 can be realized.

Example 5

FIGS. 6A to 6D are cross-sectional views showing respective process steps for producing a complementary semiconductor device according to a fifth example of the present invention.

First, a first insulating film to be used as a gate insulating film 4 of a transistor is formed on a principal surface of a semiconductor substrate so as to cover a p-type well 11 and an n-type well 21 provided in the semiconductor substrate. A conductive film to be used as an n-type gate electrode 15 of an n-channel type MOS transistor and as a p-type gate electrode 25 of a p-channel type MOS transistor is further deposited on the first insulating film. Then, a predetermined portion of the conductive film is selectively etched away by photolithography and anisotropic etching until the gate oxide film 4 is exposed, thereby forming the gate electrodes 15 and 25.

Subsequently, as shown in FIG. 6A, a first resist 31 is deposited on the principal surface of the semiconductor substrate so as to cover the p-type well (the p-type region) 11 where the n-channel type MOS transistor is to be formed. Then, p-type impurity ions, e.g., $BF_2$ ions, are implanted into the n-type well 21 while using the first resist 31 and the p-type gate electrode 25 as a mask, under the following conditions: an implantation energy of 10 KeV; and an implant dose of approximately $2\times10^{14}$ $cm^{-2}$, thereby forming a second p-type source diffusion layer 27 and a second p-type drain diffusion layer 28. Under the above-described conditions, the second source/drain diffusion layers 27 and 28 having an impurity concentration of about $5\times10^{19}$ $cm^{-3}$ are formed.

After removing the first resist 31, as shown in FIG. 6B, a second resist 32 is deposited on the principal surface of the semiconductor substrate so as to cover the n-type well (the n-type region) 21 where the p-channel type MOS transistor is to be formed. Then, n-type impurity ions, e.g., As ions, are implanted into the p-type well 11 while using the second resist 32 and the n-type gate electrode 15 as a mask under the following conditions: an implantation energy of 10 KeV; and an implant dose of approximately $2\times10^{14}$ $cm^{-2}$, thereby forming a second n-type source diffusion layer 7 and a second n-type drain diffusion layer 8 (this step of implanting the As ions is not shown in FIG. 6B). Under the above-described conditions, the second source/drain diffusion layers 7 and 8 having an impurity concentration of about $1\times10^{20}$ $cm^{-3}$ are formed.

Thereafter, p-type impurity ions, e.g., $BF_2$ ions are obliquely implanted into the p-type well 11 from the source side using the Second resist 32 and the n-type gate electrode 15 as a mask under the following conditions: an implantation angle of 7 degrees or more, e.g., 7 degrees; an implantation energy of 80 KeV; and an implant dose of about $1.5\times10^{13}$ $cm^{-2}$, thereby forming a p-type impurity diffusion layer (an asymmetric diffusion layer) 6 shown in FIG. 6B for controlling the threshold potential. Under the above-mentioned conditions, the p-type impurity diffusion layer 6. having the impurity concentration of about $4\times10^{17}$ $cm^{-3}$ in the source end and of about $1\times10^{16}$ $cm^{-3}$ in the drain end is formed.

Next, after removing the second resist 32, an oxide film is deposited on the principal surface of the semiconductor substrate to a thickness of about 80 nm. Then, the oxide film is partially removed by anisotropic dry etching so that the oxide film is left only on the side faces of the gate electrodes 15 and 25, thereby forming gate side walls (side wall spacers) 12.

Then, as shown in FIG. 6C, a third resist 33 is deposited on the principal surface of the semiconductor substrate so as to cover the n-type well (the n-type region) 21 where the p-channel type MOS transistor to be formed. Then, n-type impurity ions, e.g., As ions, are implanted into the p-type well 11 while using the third resist 33, the n-type gate electrode 15 and the gate side walls 12 as a mask under the following conditions: an implantation energy of 40 KeV; and an implant dose of approximately $6\times10^{15}$ $cm^{-2}$, thereby forming a first n-type source diffusion layer 2 and a first n-type drain diffusion layer 3. Under the above-described conditions, the first n-type source/drain diffusion layers 2 and 3 having an impurity concentration of about $3\times10^{20}$ $cm^{-3}$ are formed.

The portion of the previously formed p-type impurity diffusion layer 6 below the n-type gate electrode 15 and the gate side walls 12 remains after the ion implantation step for forming the first n-type source/drain diffusion layers 2 and 3. Similarly, the portions of the previously formed second n-type source/drain diffusion layers 7 and 8 below the gate side walls 12 remain after the same ion implantation step so as to act as extensions of the n-type source/drain diffusion layers. A portion of the p-type impurity diffusion layer 6 beneath the second drain diffusion layer 8 (the extension of the drain diffusion layer) functions as a punch-through stop layer. However, the formation of such a punch-through stop layer can be omitted. In addition, each of the diffusion layers may be formed into a prescribed shape by other method without forming the gate side walls 12, Subsequently, after removing the third resist 33, as shown in FIG. 6D, a fourth resist 34 is deposited on the principal surface of the semiconductor substrate so as to cover the p-type well (the p-type region) 11 where the n-channel type MOS transistor is to be formed. Then, p-type impurity ions, e.g., $BF_2$ ions, are implanted into the n-type well 21 while using the fourth resist 34, the p-type gate electrode 25 and the gate side walls 12 as a mask under the following conditions: an implantation energy of 30 KeV; and an implant dose of approximately $2\times10^{15}$ $cm^{-2}$, thereby forming a first p-type source diffusion layer 22 and a first p-type drain diffusion layer 23. Under the above-described conditions, the first p-type source/drain diffusion layers 22 and 23 having an impurity concentration of about $3\times10^{20}$ $cm^{-3}$ are formed.

The portions of the previously formed second p-type source/drain diffusion layers 27 and 28 below the gate side walls 12 remain after the ion implantation step for forming the first p-type source/drain diffusion layers 22 and 23 so as to act as extensions of the p-type source/drain diffusion layers. Alternatively, each of the diffusion layers may be formed into a prescribed shape by other method without forming the gate side walls 12.

In the method for producing a semiconductor device according to the fifth example of the present invention, in the step shown in FIG. 6B, p-type ions are implanted from the source side while using the n-type gate electrode 15 as a mask and setting the implantation angle at 7 degrees or more, thereby forming a p-type impurity diffusion layers (asymmetric diffusion layer) 6 for controlling the threshold potential. As a result, an asymmetric diffusion layer 6 having a nonuniform impurity concentration profile in the channel such that the impurity concentration on the source side is higher than the impurity concentration on the drain side can be easily formed without undergoing an additional masking process. Additionally, since the impurity concentration in the center portion of the channel is set to be lower than that in the vicinity of the source, a parasitic capacitance between the gate and the substrate is reduced as compared with a conventional semiconductor device having a diffusion layer with uniform impurity concentration and therefore, a semiconductor device having high drivability can be easily fabricated.

In addition, in the above-described ion implantation step, by implanting the p-type ions at an angle of 7 degrees or more, the thickness (junction depth) of the asymmetric diffusion layer 6 can be set to be smaller than the thickness (junction depth) of the first n-type source diffusion layer 2. In detail, the asymmetric diffusion layer 6 is formed so as not to cover the entire source diffusion layer 2. As a result, the impurity concentration of a region of the p-type well 11 immediately beneath the first n-type source diffusion layer 2 becomes lower than the impurity concentration of the source side portion of the asymmetric diffusion layer 6.

Moreover, according to the method of the fifth example of the present invention, prior to the formation of the asymmetric diffusion layer 6, p-type impurity ions, e.g., $BF_2$ ions are implanted into the n-type well 21 while using the first resist 31 and the p-type gate electrode 25 as a mask under the following conditions: an implantation energy of 10 KeV; and an implant dose of about $2\times10^{14}$ cm$^{-2}$, thereby forming the second p-type source/drain diffusion layers 27 and 28 as the extensions. In addition, n-type impurity ions, e.g., As ions are implanted into the p-type well 11 while using the second resist 32 and the n-type gate electrode 15 as a mask under the following conditions: an implantation energy of 10 KeV; and an implant dose of about $2\times10^{14}$ cm$^{-2}$, thereby forming the second n-type source/drain diffusion layers 7 and 8 as the extensions.

The thus-formed second n-type source/drain diffusion layers 7 and 8 are formed such that the impurity concentration thereof is $1\times10^{19}$ cm$^{-3}$ or more and the thickness thereof (junction depth D2) is smaller than the thickness of the first n-type source diffusion layer 2 and the first n-type drain diffusion layer 3 (junction depth D1). Similarly, the second p-type source/drain diffusion layers 27 and 28 are formed such that the impurity concentration thereof is $1\times10^{19}$ cm$^{-3}$ or more and the thickness thereof (junction depth D2) is smaller than the thickness of the first p-type source/drain diffusion layers 22 and 23 (junction depth D1). Thus, the extension of the potential curve (i.e., the expansion of the depletion layer) from the n-type or p-type source/drain diffusion layer along the channel length direction can be effectively suppressed and the degradation in the threshold potential in the initial stage, which is adversely caused in a region having a size on the order of a quarter micron or less, can be suppressed.

Since the impurity concentration of the second n-type source/drain diffusion layers 7 and 8 and the second p-type source/drain diffusion layers 27 and 28 is set to be $1\times10^{19}$ cm$^{-3}$ or more, the source/drain diffusion layers having a sufficiently low resistance can be formed without adversely causing the decrease in the parasitic resistance in diffusion layers having a shallow junction depth.

According to the method for producing a semiconductor device of the fifth example of the present invention, an additional masking process step which is required in a method for producing a conventional LDC structure, is not necessary. When the additional masking process step is required for a currently available method for producing a semiconductor device, then the production period of a VLSI is adversely prolonged and the production cost is disadvantageously increased. However, according to the production method of the present invention, a semiconductor device can be easily fabricated during a short period of time and at a lower cost.

The step shown in FIG. 6B may be conducted prior to the step shown in FIG. 6A. Similarly, the step shown in FIG. 6D may be conducted prior to the step shown in FIG. 6C.

According to the fifth example of the present invention, after forming the second n-type source/drain diffusion layers 7 and 8 by implanting the n-type impurity ions while using the n-type gate electrode 15 as a mask, the p-type impurity diffusion layer 6 is formed by implanting the p-type impurity ions. However, the present invention is not limited thereto. Alternatively, the second n-type source/drain diffusion layers 7 and 8 can be formed by implanting n-type impurity ions after forming the p-type impurity diffusion layer 6 by implanting p-type impurity ions while using the n-type gate electrode 15 as a mask.

In a method for producing the complementary semiconductor device according to the fifth example of the present invention, the p-type impurity diffusion layer (the asymmetric diffusion layer) 6 which extends from the source side of the channel to the drain side may be formed such that it terminates at any point in the channel region. Alternatively, it is more effective in terms of suppressing the decrease in the electric field in the channel, when the asymmetric diffusion layer 6 is formed so as to reach to the end of the channel on the drain side (for example, to the end of the second n-type drain diffusion layer 8).

According to the above-described method for producing the complementary semiconductor device according to the fifth example of the present invention, only the n-channel type MOS transistor is formed so as to be asymmetric while the p-channel type MOS transistor is formed so as to be symmetric. Alternatively, only the p-channel type MOS transistor may be formed so as to be asymmetric while the n-channel type MOS transistor is formed so as to be symmetric.

Example 6

FIGS. 7A to 7D are cross-sectional views showing respective process steps for producing a complementary semiconductor device according to a sixth example of the present invention.

First, a first insulating film to be used as a gate insulating film 4 of a transistor is formed on a principal surface of a semiconductor substrate so as to cover a p-type well 11 and an n-type well 21 provided in the semiconductor substrate. A conductive film to be used as an n-type gate electrode 15 of an n-channel type MOS transistor and as a p-type gate electrode 25 of a p-channel type MOS transistor is further deposited on the first insulating film. Then, a predetermined portion of the conductive film is selectively etched away by photolithography and anisotropic etching until the gate oxide film 4 is exposed, thereby forming the gate electrodes 15 and 25.

Subsequently, as shown in FIG. 7A, a first resist 31 is deposited on the principal surface of the semiconductor substrate so as to cover the p-type well (the p-type region) 11 where the n-channel type MOS transistor is to be formed. Then, p-type impurity ions, e.g., $BF_2$ ions, are implanted into the n-type well 21 while using the first resist 31 and the p-type gate electrode 25 as a mask under the following conditions: an implantation energy of 10 KeV; and an implant dose of approximately $2\times10^{14}$ cm$^{-2}$, thereby forming a second p-type source diffusion layer 27 and a second p-type drain diffusion layer 28 (this step of implanting the $BF_2$ ions is not shown in FIG. 7A). Under the above-described conditions, the second source/drain diffusion layers 27 and 28 having an impurity concentration of about $5\times10^{19}$ cm$^{-3}$ are formed.

Moreover, n-type impurity ions, e.g., As ions are obliquely implanted into the n-type well 21 from the source side while using the first resist 31 and the p-type gate electrode 25 as a mask under the following conditions: an implantation angle of 7 degrees or more, e.g., 7 degrees, an implantation energy of 140 KeV: and an implant dose of about $5.0\times10^{13}$ cm$^{-2}$, thereby forming the n-type impurity diffusion layer (the asymmetric diffusion layer) 26 as shown in FIG. 7A for controlling the threshold potential. Under the above-described conditions, an n-type impurity diffusion layer 26 having an impurity concentration of about $7\times10^{17}$ cm$^{-3}$ in the source end and of about $2\times10^{16}$ cm$^{-3}$ in the drain end is formed.

Then, after removing the first resist 31, as shown in FIG. 7B, a second resist 32 is deposited on the principal surface of the semiconductor substrate so as to cover the n-type well (the n-type region) 21 where the p-channel type MOS transistor is to be formed. Then, n-type impurity ions, e.g., As ions, are implanted into the p-type well 11 while using the second resist 32 and the n-type gate electrode 15 as a mask under the following conditions: an implantation energy of 10 KeV; and an implant dose of approximately $2 \times 10^{14}$ cm$^{-2}$, thereby forming a second n-type source diffusion layer 7 and a second n-type drain diffusion layer 8 (this step of implanting the As ions is not shown in FIG. 7B). Under the above-described conditions, the first source/drain diffusion layers 7 and B having an impurity concentration of about $1 \times 10^{20}$ cm$^{-3}$ are formed.

Thereafter, p-type impurity ions, e.g., BF$_2$ ions are obliquely implanted into the p-type will 11 from the source side using the second resist 32 and the n-type gate electrode 15 as a mask under the following conditions: an angle of 7 degrees or more, e.g., 7 degrees; an implantation energy of 80 KeV; and an implant dose of about $1.5 \times 10^{13}$ cm$^{-2}$, thereby forming a p-type impurity diffusion layer 6 for controlling the threshold potential as shown in FIG. 7B. Under the above-mentioned conditions, the p-type impurity diffusion layer 6 having the impurity concentration of about $4 \times 10^{17}$ cm$^{-3}$ in the source end and of about $1 \times 10^{16}$ cm$^{-3}$ in the drain end is formed.

Next, after removing the second resist 32, an oxide film is deposited on the principal surface of the semiconductor substrate to a thickness of about 80 nm. Then, the oxide film is partially removed by anisotropic dry etching so that the oxide film is left only on the side faces of the gate electrodes 15 and 25, thereby forming gate side walls (side wall spacers) 12.

Then, as shown in FIG. 7C, a third resist 33 is deposited on the principal surface of the semiconductor substrate so as to cover the n-type well (the n-type region) 21 where the p-channel type MOS transistor is to be formed. Then, n-type impurity ions, e.g., As ions, are implanted into the p-type well 11 while using the third resist 33, the n-type gate electrode 15 and the gate side walls 12 as a mask under the following conditions: an implantation energy of 40 KeV; and an implant dose of approximately $6 \times 10^{15}$ cm$^{-2}$, thereby forming a first n-type source diffusion layer 2 and a first n-type drain diffusion layer 3. Under the above-described conditions, the first n-type source/drain diffusion layers 2 and 3 having an impurity concentration of about $3 \times 10^{20}$ cm$^{-3}$ are formed.

The portion of the previously formed p-type impurity diffusion layer 6 below the n-type gate electrode 15 and the gate side walls 12 remains after the ion implantation step for forming the first n-type source/drain diffusion layers 2 and 3. Similarly, the portions of the previously formed second n-type source/drain diffusion layers 7 and 8 below the gate side walls 12 also remains after the same ion implantation step so as to act as extensions of the n-type source/drain diffusion layers. A portion of the p-type impurity diffusion layer 6 beneath the second drain diffusion layer 8 (the extension of the drain diffusion layer) functions as a punch-through stop layer. However, the formation of such a punch-through stop layer can be omitted. In addition, each of the diffusion layers may be formed into a prescribed shape by other method without forming the gate side walls 12.

Subsequently, after removing the third resist 33, as shown in FIG. 7D, a fourth resist 34 is deposited on the principal surface of the semiconductor substrate so as to cover the p-type well (the p-type region) 11 where the n-channel type MOS transistor is to be formed. Then, p-type impurity ions, e.g., BF$_2$ ions, are implanted into the n-type well 21 while using the fourth resist 34, the p-type gate electrode 25 and the gate side walls 12 as a mask under the following conditions; an implantation energy of 30 KeV; and an implant dose of approximately $2 \times 10^{15}$ cm$^{-2}$, thereby forming a first p-type source diffusion layer 22 and a first p-type drain diffusion layer 23. Under the above-described conditions, the first p-type source/drain diffusion layers 22 and 23 having an impurity concentration of about $3 \times 10^{20}$ cm$^{-3}$ are formed.

The portion of the previously formed n-type impurity diffusion layer 26 below the p-type gate electrode 25 and the side walls 12 remains after the ion implantation step for forming the first p-type source/drain diffusion layers 22 and 23. Similarly, the portions of the previously formed second p-type source/drain diffusion layers 27 and 28 below the gate side walls 12 also remain after the same ion implantation step so as to act as extensions of the p-type source/drain diffusion layers. A portion of the n-type impurity diffusion layer 26 beneath the second drain diffusion layer 28 (the extension of the drain diffusion layer) functions as a punch-through stop layer. However, the formation of such a punch-through stop layer can be omitted. In addition, each of the diffusion layers may be formed into a prescribed shape by other method without forming the gate side walls 12.

In the method for producing a semiconductor device according to the sixth example of the present invention, in the step shown in FIG. 7A, n-type ions are implanted from the source side while using the p-type gate electrode 25 as a mask and setting the implantation angle at 7 degrees or more, thereby forming the n-type impurity diffusion layer (asymmetric diffusion layer) 26 for controlling the threshold potential. As a result, an asymmetric diffusion layer 26 having a nonuniform impurity concentration profile in the channel such that the impurity concentration on the source side is higher than the impurity concentration on the drain side can be easily formed without undergoing an additional masking process. Additionally, since the impurity concentration in the center portion of the channel is set to be lower than that in the vicinity of the source, a parasitic capacitance between the gate and the substrate is reduced as compared with a conventional semiconductor device having a diffusion layer with uniform impurity concentration and therefore, a semiconductor device having high drivability can be easily fabricated.

In addition, in the above-described ion implantation step, by implanting the n-type ions at an angle of 7 degrees or more, the thickness (junction depth) of the asymmetric diffusion layer 26 can be set to be smaller then the thickness (junction depth) of the first p-type source diffusion layer 22. In detail, the asymmetric diffusion layer 26 is formed so as not to cover the entire source diffusion layer 22. As a result, the impurity concentration of a region of the n-type well 21 immediately beneath the first p-type source diffusion layer 22 becomes lower than the impurity concentration on the source side of the asymmetric n-type diffusion layer 26.

The same effect as described above in connection with the the asymmetric impurity diffusion layer 26 can be also obtained for the asymmetric p-type impurity diffusion layer 6 formed in the step shown in FIG. 7B.

Moreover, according to the method of the sixth example of the present invention, prior to the formation of the asymmetric n-type diffusion layer 26, p-type impurity ions, e.g., BF$_2$ ions are implanted into the n-type well 21 while using the first resist 31 and the p-type gate electrode 25 as a mask under the following conditions: an implantation energy of 10 KeV: and an implant dose of about $2\times10^{14}$ cm$^{-2}$, thereby forming the second p-type source/drain diffusion layers 27 and 28 as extensions. Additionally, prior to the formation of the asymmetric p-type diffusion layer 6, n-type impurity ions, e.g., As ions are implanted into the p-type well 11 while using the second resist 32 and the n-type gate electrode 15 as a mask under the following conditions; an implantation energy of 10 KeV; and an implant dose of about $2\times10^{14}$ cm$^{-2}$, thereby forming the second n-type source/drain diffusion layers 7 and 8 as the extensions.

The thus-formed second n-type source/drain diffusion layers 7 and 8 are formed such that the impurity concentration thereof is $1\times10^{19}$ cm$^{-3}$ or more and the thickness thereof (junction depth D2) is smaller than the thickness of the first n-type source diffusion layer 2 and the first n-type drain diffusion layer 3 (junction depth D1). Similarly, the second p-type source/drain diffusion layers 27 and 28 are formed such that the impurity concentration thereof is $1\times10^{19}$ cm$^{-3}$ or more and the thickness thereof (junction depth D2) is smaller than the thickness of the first p-type source diffusion layer 22 and the first p-type drain diffusion layer 23 (Junction depth D1). Thus, the extension of the potential curve (i.e., the expansion of the depletion layer) from the n-type or p-type source/drain diffusion layer along the channel length direction can be effectively suppressed and the degradation in the threshold potential in the initial stage, which is adversely caused in a region having a size on the order of a quarter micron or less, can be suppressed.

Since the impurity concentration of the second n-type source/drain diffusion layers 7 and 8 and the second p-type source/drain diffusion layers 27 and 28 is set to be $1\times10^{19}$ cm$^{-3}$ or more, the source/drain diffusion layers having a sufficiently low resistance can be formed without adversely causing the decrease in the parasitic resistance in diffusion layers having a shallow junction depth.

According to the method for producing a semiconductor device of the sixth example of the present invention, an additional masking process which is required in a method for producing a conventional LDC structure, is not necessary. When an additional masking process step is required for a currently available method for producing a semiconductor device, then the production period of a VLSI is adversely prolonged and the production cost is disadvantageously increased. However, according to the production method of the present invention, a semiconductor device can be easily fabricated during a short period of time and at a lower cost.

The step shown in FIG. 7B may be conducted prior to the step shown in FIG. 7A. Similarly, the step shown in FIG. 7D may be conducted prior to the step shown in FIG. 7C.

According to the sixth example of the present invention, after forming the second n-type source/drain diffusion layers 7 and 8, by implanting the n-type impurity ions while using the n-type gate electrode 15 as a mask, the p-type impurity diffusion layer 6 is formed by implanting the p-type impurity ions. However, the present invention is not limited thereto. Alternatively, the second n-type source/drain diffusion layers 7 and 8 can be formed by implanting n-type impurity ions after forming the p-type impurity diffusion layer 6 by implanting p-type impurity ions while using the n-type gate electrode 15 as a mask. This also applies to the case of ordering of the step of forming the second p-type source/drain diffusion layer 27 and 28 and the step of forming the n-type impurity diffusion layer 26.

In a method for producing the complementary semiconductor device according to the sixth example of the present invention, the p-type or the n-type impurity diffusion layer (the asymmetric diffusion layer) 6 or 26 which extends from the source side of the channel to the drain side may be formed such that it terminates at any point in the channel region. Alternatively, it is more effective in terms of suppressing the decrease in the electric field in the channel, when the asymmetric diffusion layer 6 or 26 is formed so as to reach to the end of the channel on the drain side (for example, to the end of the second n-type or p-type drain diffusion layer 8 or 28).

Example 7

In the case where the complementary semiconductor devices according to the present invention described heretofore, include an n-channel type MOS transistor having an asymmetric impurity concentration profile in the channel, they exhibit remarkable effect especially when used in a circuit having a structure such that a potential difference appears between a substrate and the source of the n-channel type MOS transistor during the operation of the circuit (for example, a circuit in which more than one n-channel type MOS transistor are connected in series).

Figure 9:
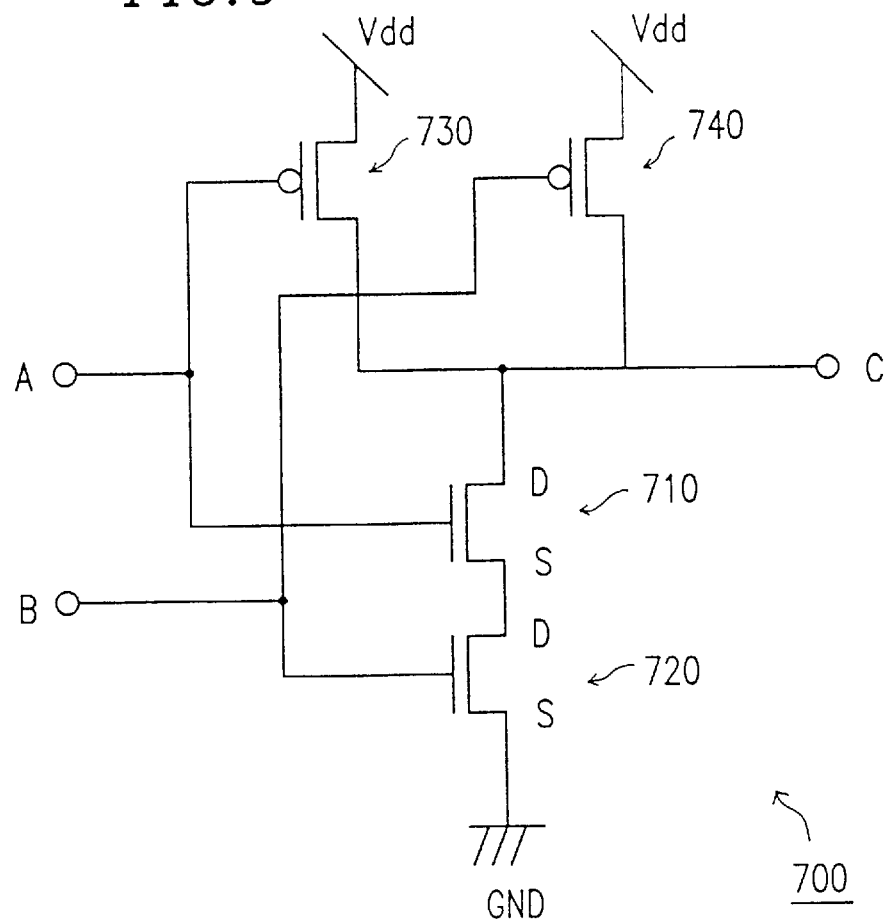
FIG. 9 is a schematic diagram showing a configuration of a two-input NAND circuit.

FIG. 9 is a schematic diagram showing a configuration of a two-input NAND circuit as an example of the above-mentioned circuit. The two-input NAND circuit generates one output C upon receiving two inputs A and B.

In the two-input NAND circuit, two n-channel type MOS transistors 710 and 720 are connected in series.

When a p-channel type transistor 730 or 740 included in the circuit is turned ON, the supply voltage Vdd is applied to the n-channel type MOS transistors 710 and 720 connected in series. Accordingly, a value of a voltage that is actually applied to one of the n-channel type MOS transistors 710 and 720 is half the value of the supply voltage, i.e., Vdd/2. In order to compensate a decrease in the driving force of the n-channel type MOS transistor caused by such a decrease in the applied voltage, an n-channel type MOS transistor with high drivability needs to be used. For this purpose, it is advantageous to use a structure having an asymmetric impurity concentration profile in a channel.

In the structure of the two-input NAND circuit shown in FIG. 9, the source of the n-channel type MOS transistor 710 is not directly connected to the GND level, Thus, when the ON/OFF operation (switching between the supply voltage Vdd level and the GND level) is repeated at fast clock frequency, the potential of the source of the n-channel type MOS transistor 710 gradually becomes far from zero, and enters into a floating state. When a potential difference appears between the source of the n-channel type MOS transistor and the substrate, a junction capacitance Cj in the p-n junction portion between the source and the substrate starts to affect the circuit operation due to transient phenomenon. Especially, when the junction capacitance Cj is large, the circuit operation may be delayed, whereby the speed of the circuit is lowered.

Figure 1:
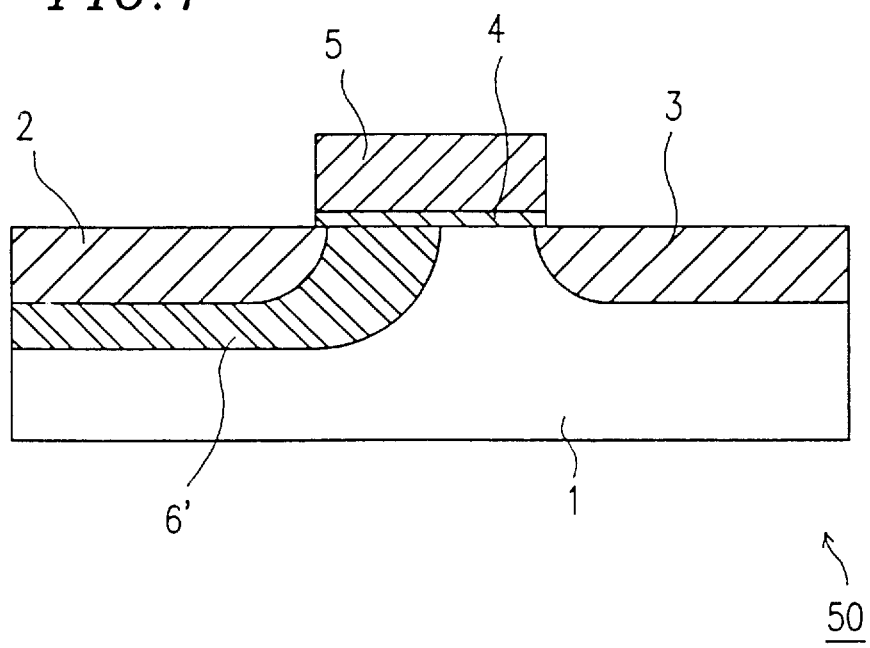
FIG. 1 is a cross-sectional view showing a structure of an exemplary MOS type semiconductor device having an LDC structure.

The junction capacitance Cj in the p-n junction portion between the source and the substrate is mainly determined by a capacitance generated in the bottom surface portion of the source region which has a large area. In the conventional asymmetric n-channel type MOS transistor, since an asymmetric diffusion layer (the high-concentration impurity diffusion layer 6' shown in FIG. 1) is provided so as to surround the entire source region, the junction capacitance Cj in the p-n junction portion between the source and the substrate is relatively large. Accordingly, the above-described adverse effect on the circuit operation caused by the junction capacitance may occur. According to the present invention, the asymmetric diffusion layer (for example, the diffusion layer 6 shown in FIGS. 4 and 5) is provided only at the end of the source region so as not to cover the entire source region. As a result, small junction capacitance Cj is formed, and thus, the problem of low drivability due to decreased application voltage can be solved in a satisfactory manner.

Example 8

In the case where the complementary semiconductor devices according to the present invention include a p-channel type MOS transistor having an asymmetric impurity concentration profile in the channel, they exhibit remarkable effect especially when used in a circuit having a structure such that a potential difference appears between the source of the p-channel type MOS transistor during the operation of the circuit (for example, a circuit in which more than one p-channel type MOS transistor are connected in series).

Figure 10:
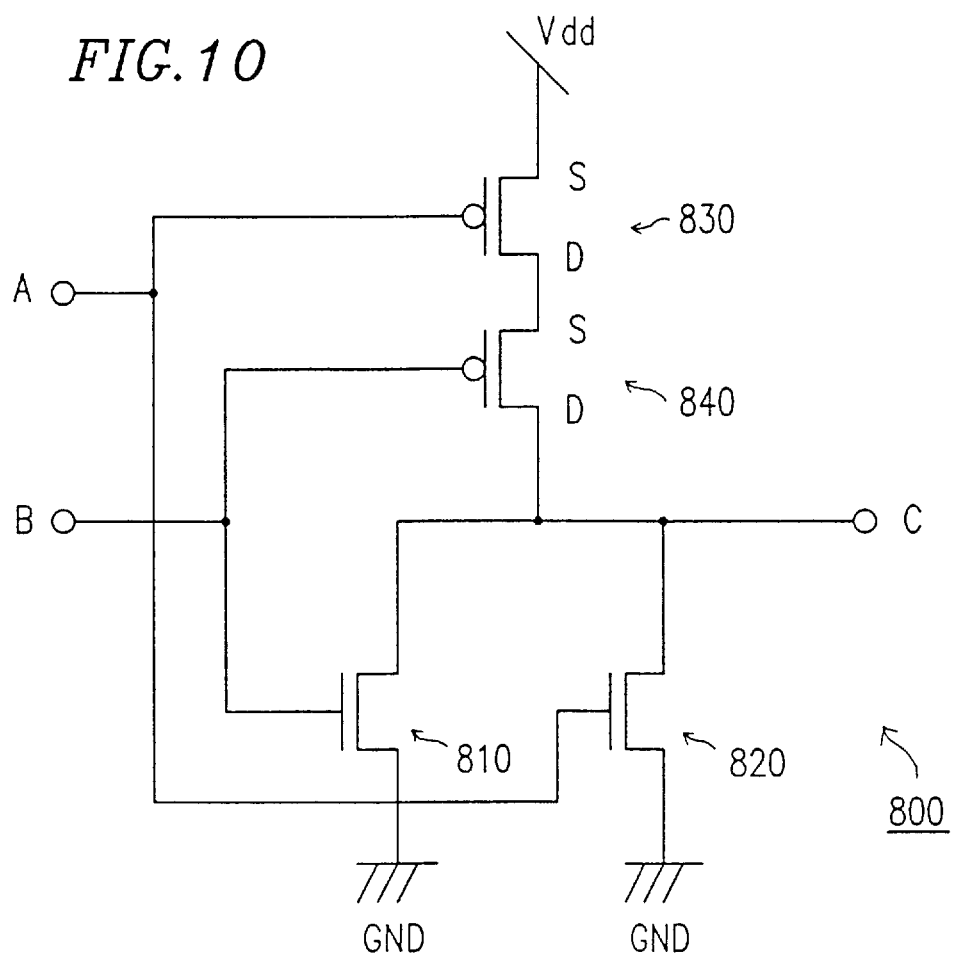
FIG. 10 is a schematic diagram showing a configuration of a two-input NOR circuit.

FIG. 10 is a schematic diagram showing a configuration of a two-input NOR circuit as an example of the above-mentioned circuit. The two-input NOR circuit generates one output C upon receiving two inputs A and B.

In the two-input NOR circuit, two p-channel type MOS transistors 830 and 840 are connected in series. When an n-channel type transistor 810 or 820 included in the circuit is turned ON, the supply voltage Vdd is applied to the p-channel type MOS transistors 830 and 840 connected in series. Accordingly, a value of a voltage that is actually applied to one of the p-channel type MOS transistors 830 and 840 is half the value of the supply voltage, i.e., Vdd/2. In order to compensate a decrease in the driving force of the p-channel type MOS transistor caused by such a decrease in the applied voltage, a p-channel type MOS transistor with high drivability needs to be used. For this purpose, it is advantageous to use a structure having an asymmetric impurity concentration profile in a channel.

In the structure of the two-input NOR circuit shown in FIG. 10, when the ON/OFF operation (switching between the supply voltage Vdd level and the GND level) is repeated at fast clock frequency, the potential of the source of the p-channel type MOS transistor 840 gradually becomes far from zero, and enters into a floating state. When a potential difference appears between the source of the p-channel type MOS transistor and the substrate, a junction capacitance Cj in the p-n junction portion between the source and the substrate starts to affect the circuit operation due to transient phenomenon. Especially, when the junction capacitance Cj is large, the circuit operation may be delayed, whereby the speed of the circuit is lowered.

The junction capacitance Cj in the p-n junction portion between the source and the substrate is mainly determined by a capacitance generated in the bottom surface portion of the source region which has a large area, In the conventional asymmetric p-channel type MOS transistor, the junction capacitance Cj in the p-n junction portion between the source and the substrate is relatively large. Accordingly, the above-described adverse effect on the circuit operation caused by the junction capacitance may occur. According to the present invention, the asymmetric diffusion layer (for example, the diffusion layer 26 shown in FIG. 5) is provided only at the end of the source region so as not to cover the entire source region. As a result, small junction capacitance Cj is formed, and thus, the problem of low drivability due to low application voltage can be solved in a satisfactory manner.

In the above-described seventh and eighth examples, a circuit configuration in which a potential difference appears between the semiconductor substrate and one of the sources of the n-channel or the p-channel type MOS transistor is described. However, the present invention is not limited thereto. The above-described effects can be obtained for a circuit configuration in which potential difference appears between the semiconductor substrate and the sources of both of the n-channel type and the p-channel type MOS transistors, by providing an asymmetric n-channel type and p-channel type MOS transistors.

Thus according to the present invention, an asymmetric diffusion layer having an asymmetric impurity concentration profile along the channel length direction is formed. The asymmetric impurity concentration profile of the diffusion layer is set such that the impurity concentration on the source side is higher than that on the drain side. Furthermore, the impurity concentration of the semiconductor substrate (or the well) immediately beneath the source diffusion layer is maintained lower than the impurity concentration in the source side portion of the asymmetric diffusion layer. Accordingly, in the semiconductor device according to the present invention, the capacitance in the p-n junction between the source and the substrate is smaller than that of the conventional semiconductor device having an LDC structure.

In general, the speed of a semiconductor device is proportional to the product obtained by multiplying together a load capacitance and the inverse of a current value. Thus, even in the case where the semiconductor device according to the present invention is applied to a NAND type CMOS circuit in which a voltage is applied to a region between the source and the substrate, the speed of the device (the speed as a whole circuit) is not deteriorated. Furthermore, the power consumed by a semiconductor device is proportional to the product obtained by multiplying together the load capacitance and the square of the applied voltage. Therefore, according to the present invention, a semiconductor device that can be operated with low power consumption can be obtained.

Furthermore, according to the present invention, the impurity concentration profile of the asymmetric diffusion layer is nonuniform along the channel length direction and the impurity concentration in the source side portion of the channel region is set to be higher than that in the drain side portion. As a result, the intensity of the electric field components generated in the channel region along the channel length direction are increased on the source side, but are decreased on the drain side, when compared with the case where the impurity is uniformly distributed in the channel region. Since the saturated current of a MOS type semiconductor device is determined by the electric field on the source side, it is possible to increase the saturated current and realize a high-speed semiconductor device according to the present inventions Also, since the generation rate of the hot carriers is determined by the electric field on the drain side, it is possible to reduce the generation rate of the hot carriers and realize a highly reliable semiconductor device according to the present invention.

Moreover, since the impurity concentration of the asymmetric diffusion layer is gradually decreased from the source side to the drain side, the intensity of the electric field components generated in the channel region along the channel length direction is not decreased in the center of the channel as compared to those in the vicinity of the source. As a result, the carriers that are accelerated by the electric field in the vicinity of the source can run inside the channel without decreasing the speed thereof.

Furthermore, according to the present invention, the extensions of the source/drain diffusion layers are formed such that the impurity concentration thereof are $1 \times 10^{19}$ cm$^{-3}$ or more and the thickness thereof (junction depth) is smaller than the thickness (Junction depth) of the main body of the source/drain diffusion layers. Thus, the extension of the potential curve (the expansion of the depletion layer) from the source/drain diffusion layers in the channel length direction can be effectively suppressed and the degradation in the threshold potential in the initial stage, which is adversely caused in a region having a size on the order of a quarter micron or less, can be suppressed.

When the impurity concentration of the extension of the source diffusion layer is set to be higher than the impurity concentration of the extension of the drain diffusion layer, a semiconductor device which has high drivability and is highly resistant to the short-channel effect can be obtained without causing a degradation in the drivability by the parasitic resistance.

Moreover, in the complementary semiconductor device according to the present invention, the Junction capacitance formed in the p-n junction portion between the source of the asymmetric MOS transistor and the substrate is small. Therefore, even in a circuit in which a potential difference appears between the source of the asymmetric MOS transistor and the substrate, the problem of low drivability due to decreased application voltage can be solved in a satisfactory manner.

Thus, according to the present invention, a highly reliable high-speed semiconductor device can be realized.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A method for producing a complementary semiconductor device including: a semiconductor substrate with a principal surface, having a first region doped with an impurity of a first conductivity type and a second region doped with an impurity of a second conductivity type; a first MOS transistor provided on the second region; and a second MOS transistor provided on the first region, the method comprising the steps of:

forming a first insulating film and a conductive film on the principal surface of the semiconductor substrate in this order so as to cover the first region and the second region;

forming a gate insulating film and a gate electrode of each of the first MOS transistor and the second MOS transistor by patterning the first insulating film and the conductive film;

forming a first resist on the principal surface of the semiconductor substrate so as to cover the second region;

forming a source region and a drain region of the second MOS transistor, each having the second conductivity type, by implanting impurity ions of the second conductivity type into the first region while using the first resist and the gate electrode of the second MOS transistor as a mask;

removing the first resist;

forming a second resist on the principal surface of the semiconductor substrate so as to cover the first region;

forming a source region and a drain region of the first MOS transistor, each having the first conductivity type, by implanting Impurity ions of the first conductivity type into the second region while using the second resist and the gate electrode of the first MOS transistor as a mask; and forming an asymmetric impurity diffusion region with an asymmetric impurity concentration profile between the source region and the drain region of the first MOS transistor each having the first conductivity type, by obliquely implanting impurity ions of the second conductivity type into the second region while using the second resist and the gate electrode of the first MOS transistor as a mask.

2. A method for producing a complementary semiconductor device according to claim 1, further comprising a step of forming an extension of the source region making contact with the source region of the first MOS transistor and the principal surface of the semiconductor substrate and having a junction depth shallower than a junction depth of the source region, and an extension of the drain region making contact with the drain region of the first MOS transistor and the principal surface of the semiconductor substrate and having a junction depth shallower than a junction depth of the drain region.

3. A method for producing a complementary semiconductor device according to claim 2, wherein the asymmetric impurity diffusion region in the first MOS transistor is formed so as to reach an end of the extension of the drain region.

4. A method for producing a complementary semiconductor device according to claim 2, wherein the first conductivity type is an n-type, the second conductivity type is a p-type, and the first MOS transistor is an n-channel type MOS transistor including the asymmetric impurity diffusion region.

5. A method for producing a complementary semiconductor device according to claim 2, wherein the first conductivity type is a p-type, the second conductivity type is an n-type, and the first MOS transistor is a p-channel type MOS transistor including the asymmetric impurity diffusion region.

6. A method for producing a complementary semiconductor device according to claim 2, further comprising a step of constituting a circuit such that a potential difference appears between the semiconductor substrate and the source of the first MOS transistor having the asymmetric impurity diffusion region during operation.

7. A method for producing a complementary semiconductor device according to claim 6, wherein the circuit includes a configuration in which a plurality of MOS transistors of the same conductivity type as the conductivity type of the first MOS transistor are connected in series.

8. A method for producing a complementary semiconductor device according to claim 1, further comprising, between the step of forming the source region and the drain region of the second conductivity type of the second MOS transistor and the step of removing the first resist, a step of forming an asymmetric impurity diffusion region having an asymmetric impurity concentration profile between the source region and the drain region of the second conductivity type of the second MOS transistor by obliquely implanting impurity ions of the first conductivity type from the source side in the first region while using the first resist and the gate electrode of the second MOS transistor as a mask.

9. A method for producing a complementary semiconductor device according to claim 8, further comprising a step of forming an extension of the source region making contact with the source region of the second MOS transistor and the principal surface of the semiconductor substrate such that a junction depth of the extension is shallower than the junction depth of the source region, and an extension of the drain region making contact with the drain region of the second MOS transistor and the principal surface of the semiconductor substrate such that a junction depth of the extension is shallower than the junction depth of the drain region.

10. A method for producing a complementary semiconductor device according to claim 9, wherein the asymmetric impurity diffusion region in the second MOS transistor is formed so as to reach an end of the extension of the drain region.

11. A method for producing a complementary semiconductor device according to claim 8, wherein the first conductivity type is an n-type, the second conductivity type is a p-type, and the first MOS transistor is an n-channel type MOS transistor including the asymmetric impurity diffusion region.

12. A method for producing a complementary semiconductor device according to claim 8, wherein the first conductivity type is a p-type, the second conductivity type is an n-type, and the first MOS transistor is a p-channel type MOS transistor having the asymmetric impurity diffusion region.

13. A method for producing a complementary semiconductor device according to claim 8, further comprising a step of constituting a circuit such that a potential difference appears during operation between the semiconductor substrate and the source of the first MOS transistor having the asymmetric impurity diffusion region and between the semiconductor substrate and the source of the second MOS transistor having the asymmetric impurity diffusion region.

14. A method for producing a complementary semiconductor device according to claim 13, wherein the circuit includes a configuration in which a plurality of MOS transistors of the same conductivity type as the conductivity type of the first MOS transistor are connected in series and a plurality of MOS transistors of the same conductivity type as the second MOS transistor are connected in series.

* * * * *

UNITED STATES PATENT AND TRADE MARK OFFICE
CERTIFICATE OF CORRECTION

PATENT NO.  : 5,830,788
DATED       : November 3, 1998
INVENTOR(S) : Hiroki et al.

It is certified that error appears in the above-identified patent and that said Letters Patent is hereby corrected as shown below:

Column 14, line 47, "$1 \times 10^{\int} cm^{-3}$," should read --$1 \times 10^{17} cm^{-3}$--.

Column 14, line 55, "$1 \times 10^{19} cm^{-3}$" should read --$1 \times 10^{18} cm^{-3}$--.

Column 15, line 55, "Junction depth DI" should read --junction depth D1--.

Column 18, line 24, "$4 \times 10^{27}$" should read --$4 \times 10^{17}$--.

Column 19, line 34, "$7 \times 10^{7} cm^{-3}$" should read --$7 \times 10^{17} cm^{-3}$--.

Column 32, line 3, "Impurity" should be --impurity--.

Column 32, line 32, "2" should be --1--.

Column 32, line 38, "2" should be --1--.

Column 32, line 44, "2" should be --1--.

Signed and Sealed this

Thirtieth Day of March, 1999

*Attest:*

Q. TODD DICKINSON

*Attesting Officer*   Acting Commissioner of Patents and Trademarks